US012701851B2

(12) United States Patent
Jang et al.

(10) Patent No.: US 12,701,851 B2
(45) Date of Patent: Aug. 4, 2026

(54) DISPLAY DEVICE WITH PHOTO DETECTOR

(71) Applicant: LG Display Co., Ltd., Seoul (KR)

(72) Inventors: Yoonnara Jang, Paju-si (KR);
Seungrok Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/212,084

(22) Filed: May 19, 2025

(65) Prior Publication Data

US 2026/0190564 A1    Jul. 2, 2026

(30) Foreign Application Priority Data

Dec. 26, 2024    (KR) ........................ 10-2024-0197447

(51) Int. Cl.
| | |
|---|---|
| *H10H 29/34* | (2025.01) |
| *G06V 40/13* | (2022.01) |
| *G09G 3/32* | (2016.01) |
| *H10H 29/37* | (2025.01) |

(52) U.S. Cl.
CPC ......... *H10H 29/34* (2025.01); *G06V 40/1318* (2022.01); *G09G 3/32* (2013.01); *H10H 29/37* (2025.01); *G09G 2330/021* (2013.01); *G09G 2360/14* (2013.01)

(58) Field of Classification Search
CPC .... H10H 29/34; H10H 29/37; G06V 40/1318; G09G 3/32; G09G 2330/021; G09G 2360/14
See application file for complete search history.

(56) References Cited

U.S. PATENT DOCUMENTS

| | | | |
|---|---|---|---|
| 10,215,698 B2 | 2/2019 | Han et al. | |
| 11,073,712 B2 | 7/2021 | Yeke Yazdandoost et al. | |
| 2016/0058312 A1 | 3/2016 | Han et al. | |
| 2016/0357265 A1 | 12/2016 | Maani | |
| 2018/0196931 A1* | 7/2018 | Cho ........................ G06F 21/32 |
| 2019/0310724 A1 | 10/2019 | Yeke Yazdandoost et al. | |
| 2022/0130919 A1* | 4/2022 | Zhang .................. G09G 3/3233 |

FOREIGN PATENT DOCUMENTS

| | | |
|---|---|---|
| KR | 10-2016-0027916 A | 3/2016 |
| KR | 10-2019-0105664 A | 9/2019 |
| KR | 10-2022-0088511 A | 6/2022 |

* cited by examiner

*Primary Examiner* — Yaron Cohen
(74) *Attorney, Agent, or Firm* — Fenwick & West LLP

(57) ABSTRACT

A display device is provided, a plurality of sub-pixels disposed in each of the plurality of first pixels and each of the plurality of second pixels, and a sensing unit disposed in each of the plurality of second pixels, wherein each of the plurality of sub-pixels includes a light emitting device, and the sensing unit includes a photo detector.

14 Claims, 17 Drawing Sheets

PX2

DISPLAY DEVICE WITH PHOTO DETECTOR

CROSS-REFERENCE TO RELATED APPLICATION

This application claims the benefit of the Republic of Korea Patent Application No. 10-2024-0197447 filed on Dec. 26, 2024, which is hereby incorporated by reference in its entirety.

BACKGROUND

Field of Technology

The present disclosure relates to a display device.

Description of the Related Art

The display device is applied to various electronic devices such as televisions (TVs), mobile phones, laptops, and tablets.

The display devices include an organic light emitting display (OLED) that emit light by themselves and a liquid crystal display (LCD) that require a separate light source.

Recently, a display device including a light emitting diode (LED) has attracted attention as a next-generation display device. The light emitting diode is made of an inorganic material, not an organic material. Accordingly, compared to the liquid crystal display or the organic light emitting display device, the display device including the light emitting diode has a faster lighting speed, excellent luminous efficiency, and displays an image having high luminance.

In addition, research is being conducted to acquire the user's biometric information such as fingerprints and utilize the acquired biometric information when the display device is driven.

SUMMARY

The present disclosure has been made in view of the above problems and it is an embodiment of the present disclosure to provide a display device capable of acquiring biometric information.

In addition, the present disclosure has been made in view of the above problems and it is an embodiment of the present disclosure to provide a low-power display device that can reduce power consumption by improving transmittance and aperture ratio.

In accordance with an embodiment of the present disclosure, the above and other technical effects can be accomplished by the provision of a display device comprising a substrate including a first display area and a second display area adjacent to the first display area, a plurality of first pixels disposed in the first display area on the substrate, a plurality of second pixels disposed in the second display area on the substrate, a pixel driving circuit disposed in each of the plurality of first pixels and each of the plurality of second pixels on the substrate, a plurality of sub-pixels disposed in each of the plurality of first pixels and each of the plurality of second pixels on the pixel driving circuit, and a sensing unit disposed in each of the plurality of second pixels on the pixel driving circuit, and wherein each of the plurality of sub-pixels includes a light emitting device, and the sensing unit includes a photo detector, and wherein the light emitting device is a micro LED.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

Figure 1:
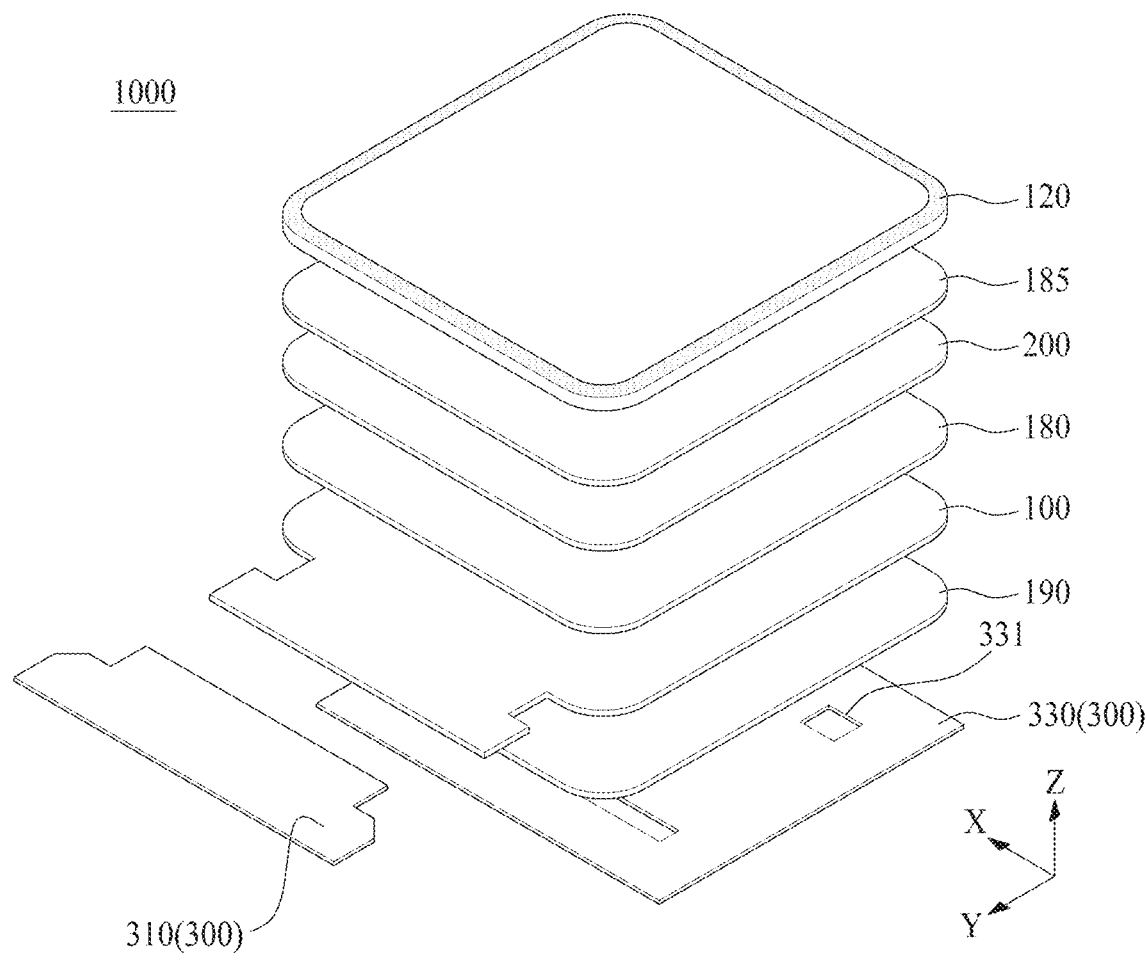
FIG. 1 is an exploded perspective view of a display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. The progression of processing steps and/or operations described is an example; however, the sequence of steps and/or operations is not limited to that set forth herein and may be changed as is known in the art, with the exception of steps and/or operations necessarily occurring in a particular order. Names of the respective elements used in the following explanations may be selected only for convenience of writing the specification and may be thus different from those used in actual products.

Advantages and features of the present disclosure and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Further, the present disclosure is only defined by scopes of claims.

A shape, a size, a ratio, an angle and a number disclosed in the drawings for describing embodiments of the present disclosure are merely an example and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have' and 'include' described in the present disclosure are used, another portion may be added unless 'only-' is used. The terms of a singular form may include plural forms unless referred to the contrary.

The word "exemplary" is used to mean serving as an example or illustration. Aspects are example aspects. "Embodiments," "examples," "aspects," and the like should not be construed as preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In construing an element, the element is construed as including an error band although there is no explicit description. Any implementation described herein as an "example" is not necessarily to be construed as preferred or advantageous over other implementations.

In describing a position relationship, for example, when the position relationship is described as 'upon~', 'above~', 'below~' and 'next to~', one or more portions may be disposed between two other portions unless 'just' or 'direct' is used. The terms, such as "below," "lower," "above," "upper" and the like, may be used herein to describe a relationship between element (s) as illustrated in the drawings. It will be understood that the terms are spatially relative and based on the orientation depicted in the drawings.

It will be understood that, although the terms "first," "second," "A," "B," "(a)," and "(b)" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first element, a second element, and a third element" compasses the combination of all three listed elements, combinations of any two of the three elements, as well as each individual element, the first element, the second element, or the third element.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in a co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, one embodiment of the present disclosure will be described in detail with reference to the accompanying drawings.

FIG. 1 is an exploded perspective view of a display device according to an embodiment of the present disclosure.

Referring to FIG. 1, a display device 1000 according to an embodiment of the present disclosure may include a display panel 100, a cover member 120, a polarizing layer 180, an adhesive layer 185, a support substrate 190, and a driving circuit unit 300.

The display panel 100 may implement information, a video, and/or an image provided to a user. Also, the display panel 100 may sense a user's touch. The cover member 120 is disposed on the display panel 100 and may protect the display panel 100. The polarizing layer 180 may be disposed between the display panel 100 and the cover member 120. The polarizing layer 180 may prevent or reduce light generated from an external light source from entering the display panel 100 and affecting a light emitting device or the like. The adhesive layer 185 may be disposed between polarizing layer 180 and the cover member 120 and may attach the cover member 120 to the polarizing layer 180. The support substrate 190 may be disposed on a rear surface of the display panel 100. The support substrate 190 may reinforce rigidity of the display panel 100.

The driving circuit unit 300 or driving circuit may be electrically connected to the display panel 100. The driving circuit unit 300 may generate a signal required to display an image on the display panel 100 and supply the signal to the display panel 100. The driving circuit unit 300 may include a flexible circuit board 310 and a printed circuit board 330.

The flexible circuit board 310 and the printed circuit board 330 may be disposed on a bottom of the display panel 100. The flexible circuit board 310 and the printed circuit board 330 may be disposed on a rear surface of the support substrate 190. One side of the flexible circuit board 310 may be attached to the display panel 100, and the other side of the flexible circuit board 310 may be attached to the printed circuit board 330, but is not limited thereto. The printed circuit board 330 may include at least one hole 331. An internal component may be disposed in an area corresponding to the at least one hole 331. The internal component may include an ambient light sensor (ALS) or a temperature sensor, but is not limited thereto.

The display device 1000 according to an embodiment of the present disclosure may further include a touch panel 200. The touch panel 200 may sense a user's touch in the display panel 100. The touch panel 200 may be disposed between the display panel 100 and the cover member 120. The touch panel 200 may include a touch electrode layer. For example, the touch electrode layer may include an electrode structure corresponding to a mutual-capacitance type in which a plurality of touch driving electrodes and a plurality of touch sensing electrodes cross each other or a self-capacitance type in which only a plurality of touch sensing electrodes are formed. The driving circuit unit 300 may sense a change in capacitance of the touch electrode configured on the touch panel 200.

Figure 2:
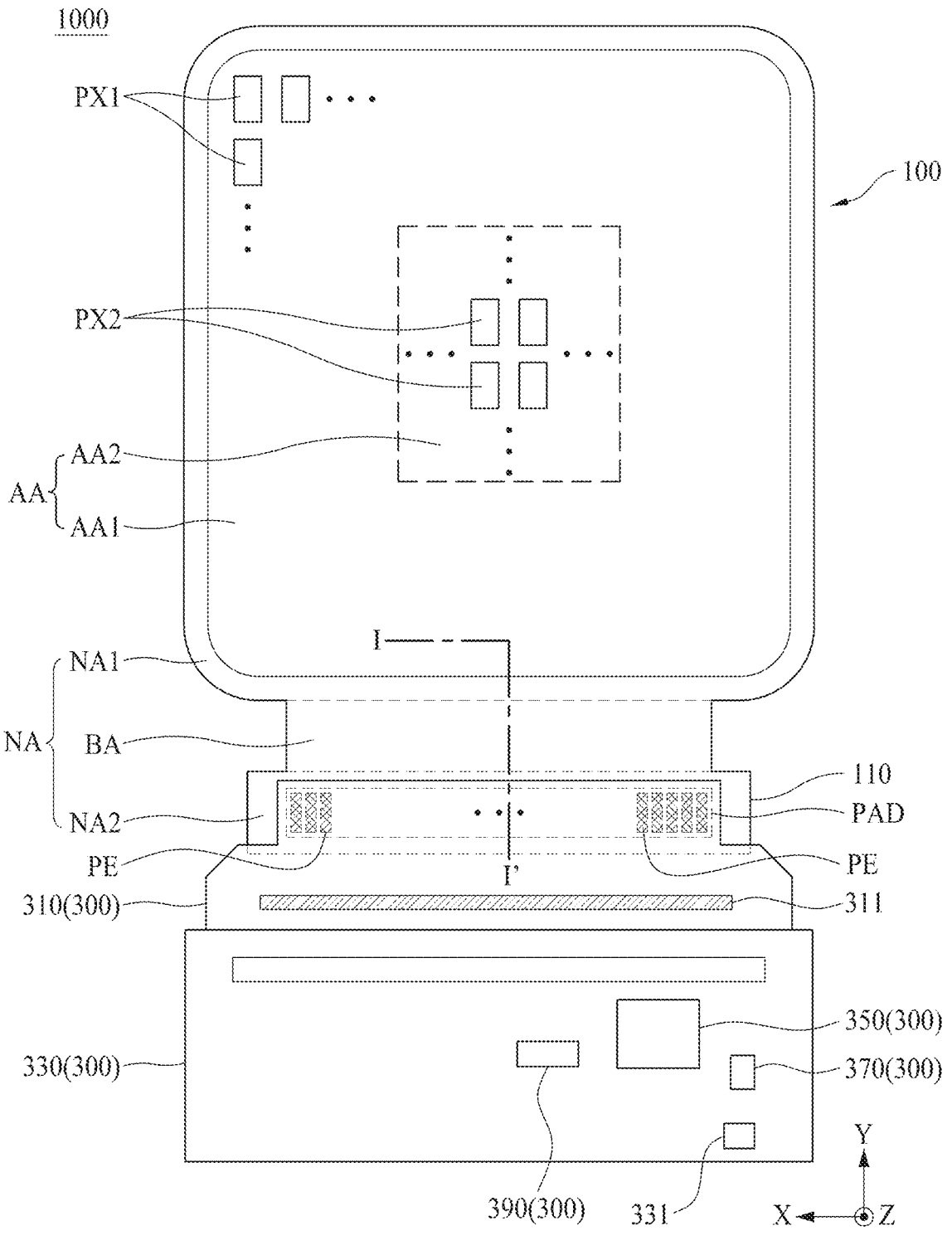
FIG. 2 is a plan view of a display device according to an embodiment of the present disclosure.
Figure 3:
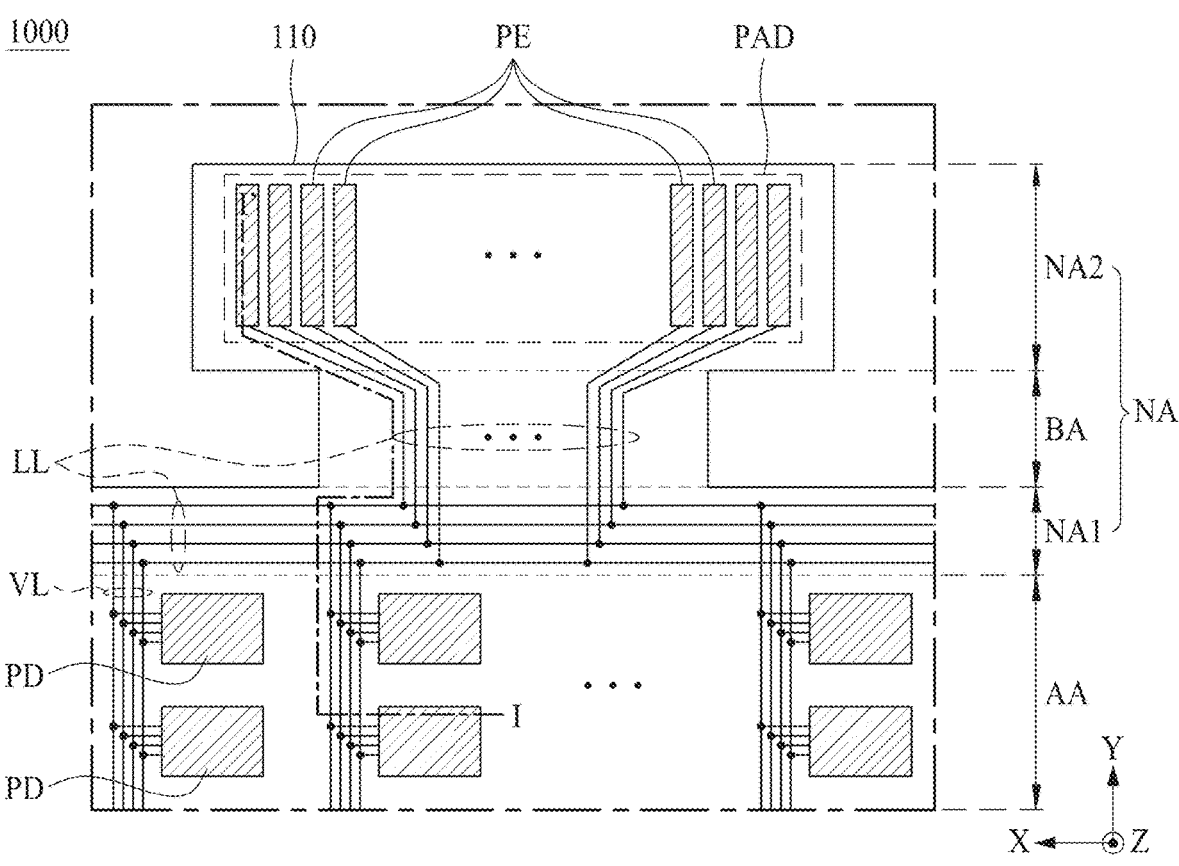
FIG. 3 is an enlarged view of a display device according to an embodiment of the present disclosure.

FIG. 2 is a plan view of a display device according to an embodiment of the present disclosure. FIG. 3 is an enlarged view of a display device according to an embodiment of the present disclosure.

Referring to FIGS. 2 and 3, the display device 1000 may include the display panel 100, the flexible circuit board 310, and the printed circuit board 330.

The display panel 100 may include a substrate 110. The substrate 110 may be made of an insulating material such as glass or resin. Also, the substrate 110 may be made of a material having flexibility such as polyimide (PI).

The display panel 100 may include a display area AA and a non-display area NA. For example, the substrate 110 may include the display area AA and the non-display area NA. The display area AA and the non-display area NA are not limited to the substrate 110 but may be described throughout the display device 1000.

The display area AA may be an area in which an image is displayed. The display area AA may include a first display area AA1 and a second display area AA2. The non-display area NA may be an area surrounding the first display area AA1, and the first display area AA1 may be an area surrounding the second display area AA2. The second display area AA2 may be a central area of the display area AA, but is not limited thereto. Also, the display area AA may include only the second display area AA2, but is not limited thereto.

The display area AA may include a plurality of pixels PX. The plurality of pixels PX may include a plurality of first pixels PX1 and a plurality of second pixels PX2. The plurality of first pixels PX1 may be disposed in the first display area AA1 and the plurality of second pixels PX2 may be disposed in the second display area AA2.

Each of the plurality of first pixels PX1 may include a plurality of sub-pixels and each of the plurality of second pixels PX2 may include a plurality of sub-pixels and a sensing unit. Each of the plurality of sub-pixels may include a plurality of light emitting devices, and the sensing unit may include a photo detector.

The plurality of light emitting devices and the photo detector may be configured to be different according to a type of the display device 1000. For example, when the display device 1000 is an inorganic light emitting display device, the light emitting device may be a light-emitting diode (LED), a micro light-emitting diode (Micro-LED), or a mini-light-emitting diode (MLED), but embodiments of the present disclosure are not limited thereto. In addition, the photo detector may be a photoelectric conversion device such as a p-n type photodiode or a pin type photodiode, but embodiments of the present disclosure are not limited thereto.

Referring to FIG. 3, a plurality of pixel driving circuits PD may be disposed in the display area AA. The plurality of pixel driving circuits PD may be disposed in each of the plurality of first pixels PX1 and the plurality of second pixels PX2.

In the plurality of first pixels PX1, the plurality of pixel driving circuits PD may be circuits for driving light emitting devices of the plurality of sub-pixels. In addition, in the plurality of second pixels PX2, the plurality of pixel driving circuits PD may be circuits for driving light emitting devices of the plurality of sub-pixels and the photo detector of a sensing unit. That is, each of the plurality of pixel driving circuits PD may control a light emitting operation of the plurality of light emitting devices and a light receiving operation of the photo detector. In addition, each of the plurality of pixel driving circuits PD is a microchip or chipset and may be a semiconductor packaging device with a fine size including a plurality of transistors and storage capacitors.

The non-display area NA may be an area in which no image is displayed. The non-display area NA may include various wirings and driving circuits 311 for driving the plurality of pixels PX disposed in the display area AA. The driving circuit 311 may include a driving integrated circuit. For example, the driving circuit 311 may be a data driving circuit and/or a gate driving circuit, but is not limited thereto.

The non-display area NA may include a first non-display area NA1, a bending area BA, and a second non-display area NA2. For example, the first non-display area NA1 may be an area surrounding at least a portion of the display area AA. The bending area BA may be an area extending from at least one of a plurality of sides of the first non-display area NA1 and may be a bendable area. The second non-display area NA2 is an area extending from the bending area BA, and the pad part PAD may be disposed.

A plurality of link lines LL may be disposed in the non-display area NA. The plurality of link lines LL may extend from a plurality of pad electrodes PE of the second non-display area NA2 toward the bending area BA and the first non-display area NA1 and may be electrically connected to a plurality of driving lines VL of the display area AA. The plurality of driving lines VL may be disposed in the display area AA and electrically connected to each of the plurality of pixel driving circuits PD. Accordingly, the plurality of pixel driving circuits PD may be driven by receiving signals from one or more flexible circuit boards 310 and printed circuit boards 330 through the driving lines VL in the display area AA and the link line LL in the non-display area NA.

A pad part PAD including a plurality of pad electrodes PE may be disposed in the second non-display area NA2. The plurality of pad electrodes PE of the pad part PAD may be electrically connected to one or more flexible circuit boards 310. Also, the printed circuit board 330 may be electrically connected to one or more flexible circuit boards 310 and may supply a signal to the driving integrated circuit 311 mounted on the flexible circuit board 310. Accordingly, the pad part PAD may transmit various signals received from the printed circuit board 330 and the flexible circuit board 310 to the plurality of pixel driving circuits PD.

The driving circuit unit 300 may further include a timing controller 350, a power management integrated circuit 370, and a touch integrated circuit 390. The timing controller 350 may control a driving timing of each of the driving integrated circuit 311 and the plurality of pixel driving circuits PD based on a timing synchronization signal. The power management integrated circuit 370 may generate and output various power sources for driving the display device 1000. The touch integrated circuit 390 may supply a touch driving signal to the touch electrode in response to the touch synchronization signal supplied from the timing controller 350.

Figure 4:
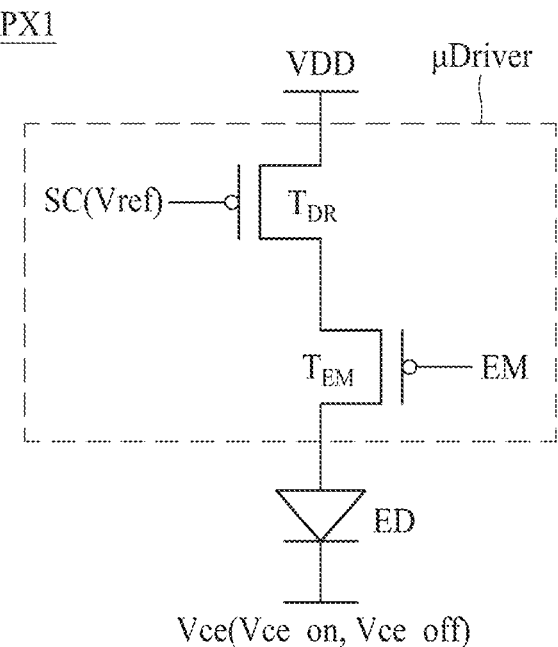
FIG. 4 is a diagram illustrating a circuit of a first pixel according to an embodiment of the present disclosure.

FIG. 4 is a diagram illustrating a circuit of a first pixel PX1 according to an embodiment of the present disclosure. FIG. 4 is a diagram illustrating one micro-driver included in each of the plurality of pixel driving circuits PD illustrated in FIG. 3.

FIG. 4 illustrates that one light emitting device ED is connected to one micro-driver (μDriver), but is not limited thereto. For example, 8 light emitting devices ED, 16 light emitting devices ED, 32 light emitting devices ED, or 64 light emitting devices ED may be connected to one micro-driver (μDriver). In addition, the light emitting device ED may be a micro light emitting device, a micro light emitting diode, or a micro light emitting diode chip. The light emitting device ED may have a scale of 1 μm to 100 μm, but is not limited thereto.

One micro-driver (Driver) may include a driving transistor $T_{DR}$ and a light emitting transistor $T_{EM}$, but embodiments of the present disclosure are not limited thereto. A high potential power voltage VDD may be applied to a first electrode of the driving transistor $T_{DR}$, a first electrode of the light emitting transistor $T_{EM}$ may be connected to a second electrode of the driving transistor $T_{DR}$, and a scan signal SC may be applied to a gate electrode of the driving transistor $T_{DR}$. The second electrode of the driving transistor $T_{DR}$ may be connected to a first electrode of the light emitting transistor $T_{EM}$, the light emitting device ED may be connected to a second electrode of the light emitting transistor $T_{EM}$, and a light emitting signal EM may be applied to a gate electrode of the light emitting transistor $T_{EM}$. Each of the driving transistor $T_{DR}$ and the light emitting transistor $T_{EM}$ may be an n-type transistor or a p-type transistor.

A first electrode of the light emitting device ED may be connected to the second electrode of the light emitting transistor $T_{EM}$, and a second electrode of the light emitting device ED may be connected to ground. For example, the first electrode of the light emitting device ED may be an anode, and the second electrode of the light emitting device ED may be a cathode, but embodiments of the present disclosure are not limited thereto. The voltage applied to the first electrode of the light emitting device ED from the light emitting transistor $T_{EM}$ may be an anode voltage. The voltage applied to the low-potential power line may be a cathode voltage Vce. The cathode voltage Vce may be a cathode-on voltage Vce-on or a cathode-off voltage Vce_off. When the driving transistor $T_{DR}$ and the light emitting transistor $T_{EM}$ are turned on, a driving current may be applied to the light emitting device ED via the driving transistor $T_{DR}$ and the light emitting transistor $T_{EM}$. Accordingly, the light emitting device ED may emit light.

Figure 5:
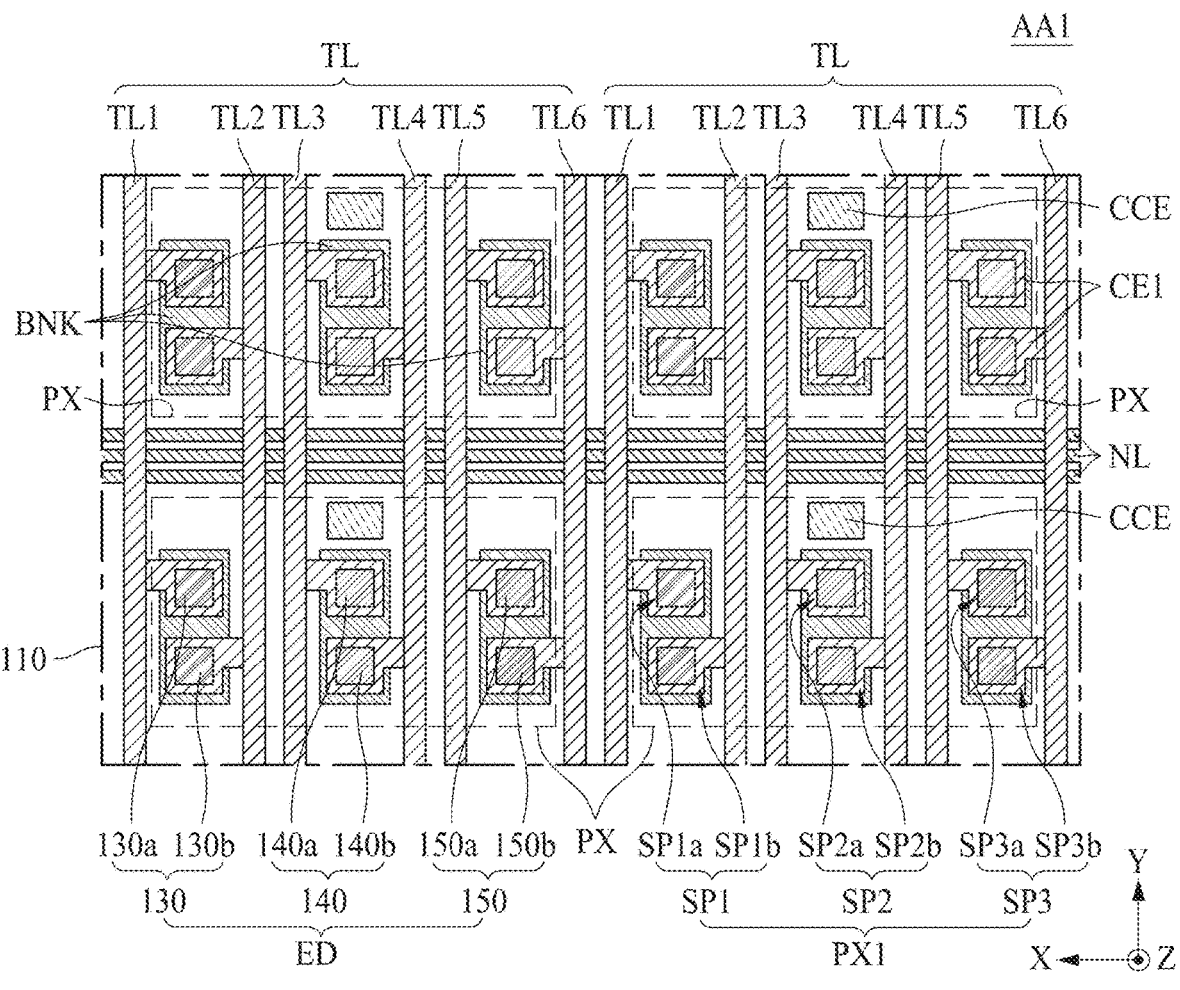
FIG. 5 is a plan view of a first display area of a display device according to an embodiment of the present disclosure.
Figure 6:
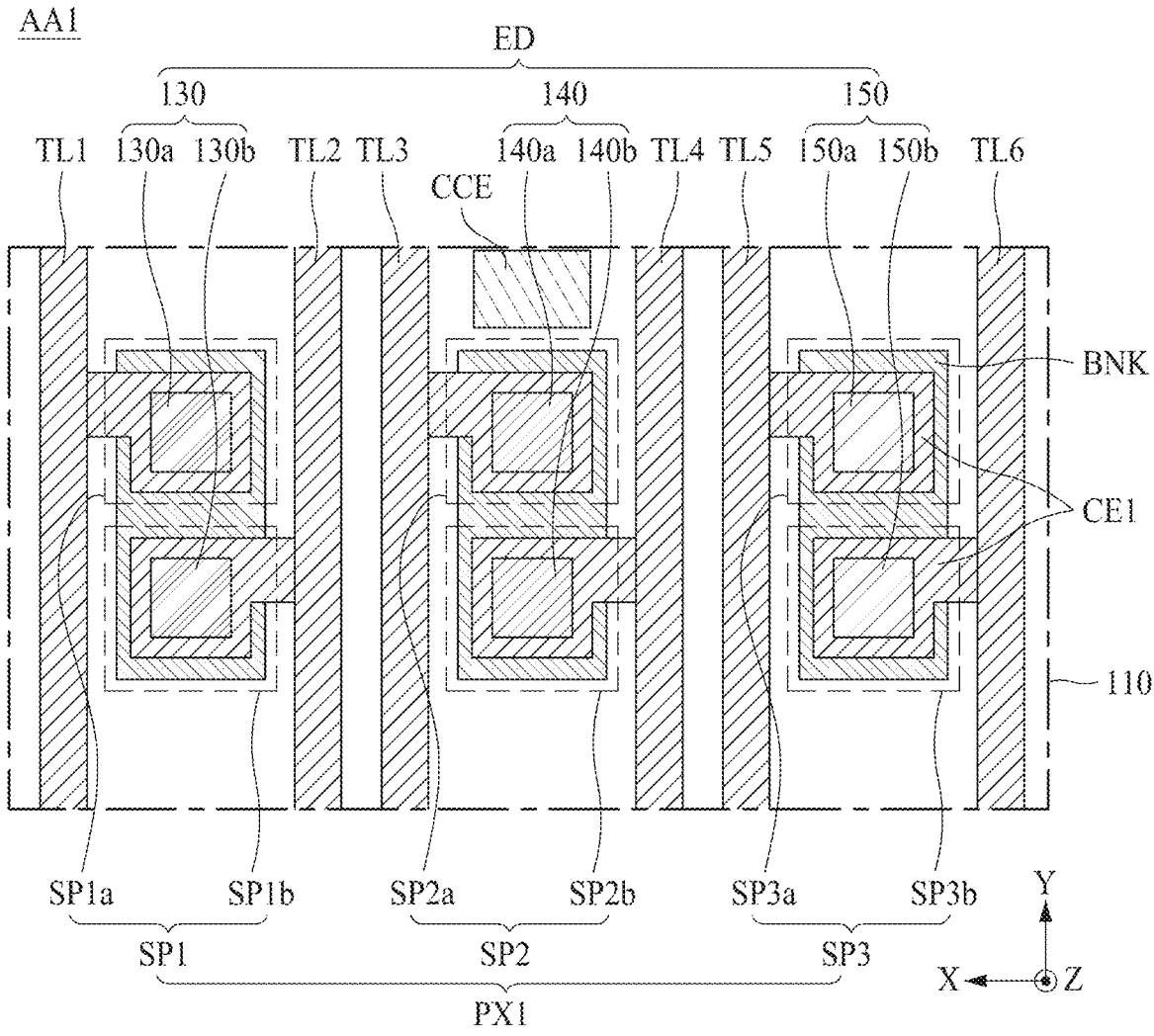
FIG. 6 is a plan view of a first display area of a display device according to an embodiment of the present disclosure.
Figure 7:
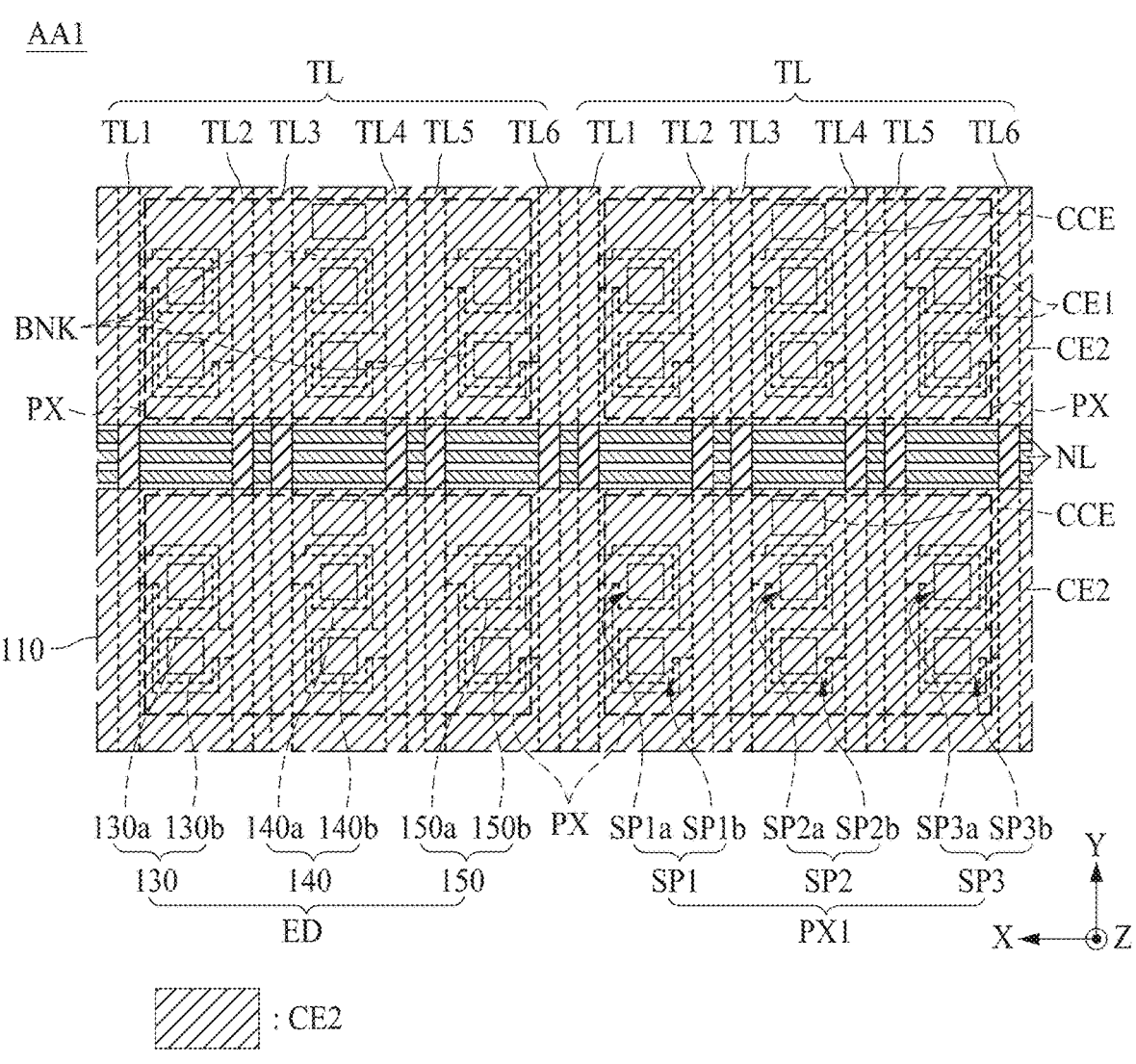
FIG. 7 is a plan view of a first display area of a display device according to an embodiment of the present disclosure.

FIGS. 5 to 7 are plan views of a display device according to an embodiment of the present disclosure. For example, FIG. 5 is an enlarged view of the first display area AA1 in which the plurality of first pixels PX1 are included. For example, FIG. 6 is an enlarged view of the first display area AA1 in which one first pixel PX1 is included. For example, FIG. 7 is an enlarged view of the first display area AA1 in which the plurality of first pixels PX1 are included.

FIG. 5 and FIG. 6 illustrate a plurality of signal lines TL, a plurality of communication lines NL, a plurality of first electrodes CE1, a plurality of banks BNK, and a plurality of light emitting devices ED. FIG. 7 is an enlarged plan view in which the plurality of second electrodes CE2 are additionally disposed in FIG. 5, for convenience, an area overlapping the second electrodes CE2 is indicated by a dotted line.

Referring to FIGS. 5 to 7, a first plurality of pixels PX1 including a plurality of sub-pixels may be disposed in the first display area AA1. Each of the plurality of sub-pixels includes a light emitting device ED and may independently emit light. The plurality of sub-pixels may be configured in a plurality of rows and a plurality of columns and may be disposed in a matrix form, but embodiments of the present disclosure are not limited thereto.

The plurality of sub-pixels may include a first sub-pixel SP1, a second sub-pixel SP2, and a third sub-pixel SP3. The first sub-pixel SP1, the second sub-pixel SP2, and the third sub-pixel SP3 may be disposed in a row direction (or the first direction X). In addition, any one of the first sub-pixel SP1, the second sub-pixel SP2, and the third sub-pixel SP3 may be a red sub-pixel, another may be a green sub-pixel, and the other may be a blue sub-pixel.

Each of the plurality of first pixels PX1 may include one or more first sub-pixels SP1, one or more second sub-pixels SP2, and one or more third sub-pixels SP3. For example, one first pixel PX1 may include a pair of first sub-pixels SP1, a pair of second sub-pixels SP2, and a pair of third sub-pixels SP3.

The pair of first sub-pixels SP1 may include a 1-1th sub-pixel SP1*a* and a 1-2th sub-pixel SP1*b*. The pair of second sub-pixels SP2 may include a 2-1th sub-pixel SP2*a* and a 2-2th sub-pixel SP2*b*. The pair of third sub-pixels SP3 may include a 3-1th sub-pixel SP3*a* and a 3-2th sub-pixel SP3*b*. That is, one first pixel PX1 may include the 1-1th sub-pixel SP1*a*, the 1-2th sub-pixel SP2*a*, the 2-1th sub-pixel SP2*a*, the 2-2th sub-pixel SP2*b*, the 3-1th sub-pixel SP3*a*, and the 3-2th sub-pixel SP3*b*.

In one first pixel PX1, the plurality of sub-pixels may be variously arranged. For example, in one first pixel PX1, the pair of first sub-pixels SP1 may be disposed in the same column, the pair of second sub-pixels SP2 may be disposed in the same column, and the pair of third sub-pixels SP3 may be disposed in the same column. In addition, the first sub-pixel SP1, the second sub-pixel SP2, and the third sub-pixel SP3 may be disposed in the same row.

The plurality of signal lines TL may be disposed in an area between the plurality of sub-pixels. The plurality of signal lines TL may extend in the column direction (or a second direction Y) between the plurality of sub-pixels. The plurality of signal lines TL may be lines that transmit the anode voltage from the pixel driving circuit PD (showed in FIG. 3) to the plurality of sub-pixels.

Specifically, the plurality of signal lines TL may be electrically connected to the plurality of pixel driving circuits PD (showed in FIG. 3) and the first electrode CE1 of the plurality of sub-pixels. The anode voltage output from the pixel driving circuit PD (showed in FIG. 3) may be transmitted to the first electrode CE1 of the plurality of sub-pixels through the plurality of signal lines TL. In addition, the first electrode CE1 may be an electrode electrically connected to the anode 134 of the light emitting device ED (showed in FIG. 9). Accordingly, the anode voltage from the signal line TL may be transmitted to the anode 134 of the light emitting device ED (showed in FIG. 9) through the first electrode CE1.

Therefore, instead of forming a plurality of transistors and storage capacitors in each of the plurality of sub-pixels, a structure of the display device 1000 may be simplified by using a pixel driving circuit PD (showed in FIG. 3) in which the plurality of pixel circuits are integrated in one pixel driving circuit PD (showed in FIG. 3). In addition, since a circuit disposed in each of the plurality of sub-pixels is integrated in one pixel driving circuit PD (showed in FIG. 3), high efficiency and low power driving may be possible.

The plurality of signal lines TL may include a first signal line TL1, a second signal line TL2, a third signal line TL3, a fourth signal line TL4, a fifth signal line TL5, and a sixth signal line TL6. Each of the first signal line TL1 and the second signal line TL2 may be electrically connected to each of the pair of first sub-pixels SP1. The third signal line TL3 and the fourth signal line TL4 may be electrically connected to each of the pair of second sub-pixels SP2. Each of the fifth signal line TL5 and the sixth signal line TL6 may be electrically connected to each of the pair of third sub-pixels SP3. The plurality of signal lines TL may be formed of a conductive material. In addition, the plurality of signal lines TL may be formed of a multilayer structure of a conductive material.

The plurality of communication lines NL may be disposed in an area between the plurality of first pixels PX1. The plurality of communication lines NL may be wirings used for short-range communication such as near field communication (NFC) and may function as antennas.

Banks BNK may be disposed in each of the plurality of sub-pixels. The plurality of banks BNK may guide positions of the plurality of light emitting devices ED in a transfer process of the plurality of light emitting devices ED. That is, the plurality of light emitting devices ED may be transferred onto the plurality of banks BNK in the transfer process of the plurality of light emitting devices ED. An entire area of the light emitting device ED may overlap the bank BNK.

The bank BNK of the first sub-pixel SP1, the bank BNK of the second sub-pixel SP2, and the bank BNK of the third sub-pixel SP3 may be disposed to be spaced apart from each other. In addition, the bank BNK of the first sub-pixel SP1, the bank BNK of the second sub-pixel SP2, and the bank BNK of the third sub-pixel SP3 may be configured to be separated.

The plurality of banks BNK may be formed of an organic insulating material. In addition, the plurality of banks BNK may be formed of a single layer or a multilayer of an organic insulating material. For example, the plurality of banks BNK may be formed of a photo resist, a polyimide (PI), an acryl-based material, or the like, but embodiments of the present disclosure are not limited thereto.

The first electrode CE1 may be disposed in each of the plurality of sub-pixels. The first electrode CE1 may be disposed on the bank BNK. At least a portion of the first electrode CE1 may extend to an outside of the bank BNK to be electrically connected to the signal line TL closest to the first electrode CE1. A portion of the first electrode CE1 may overlap the bank BNK, and the remaining area of the first electrode CE1 may not overlap the bank BNK.

The first electrode CE1 is electrically connected to the anode 134 (showed in FIG. 9) of the light emitting device ED. The anode voltage from the pixel driving circuit PD (showed in FIG. 3) may be transmitted to the light emitting device ED via the signal line TL and the first electrode CE1. The pixel driving circuit PD (showed in FIG. 3) may apply the same voltage (or anode voltage) to the first electrode CE1 in each of the plurality of sub-pixels, but is not limited thereto.

The first electrode CE1 may be formed of a conductive material. The first electrode CE1 may be formed integrally with the plurality of signal lines TL. In addition, the first electrode CE1 may be formed of the same conductive material as the plurality of signal lines TL, but embodiments of the present disclosure are not limited thereto.

The plurality of light emitting devices ED may be disposed on the first electrode CE1 to overlap the bank BNK and the first electrode CE1. The entire area of the plurality of light emitting devices ED may overlap the bank BNK and the first electrode CE1. In addition, the plurality of light emitting devices ED are in contact with the first electrode CE1 and may be electrically connected to the first electrode CEL. Accordingly, the light emitting device ED may emit light by receiving the anode voltage from the pixel driving circuit PD through the signal line TL and the first electrode CEL.

The plurality of light emitting devices ED may include a first light emitting device 130, a second light emitting device 140, and a third light emitting device 150.

The first light emitting device 130 may be disposed in the first sub-pixel SP1. The second light emitting device 140 may be disposed in the second sub-pixel SP2. The third light emitting device 150 may be disposed in the third sub-pixel SP3. One of the first light emitting device 130, the second light emitting device 140, and the third light emitting device 150 may be a red light emitting device, another may be a green light emitting device, and the other may be a blue light emitting device, but embodiments of the present disclosure are not limited thereto.

The first light emitting device 130 may include a 1-1th light emitting device 130a disposed in the 1-1th sub-pixel SP1a and a 1-2th light emitting device 130b disposed in the 1-2th sub-pixel SP1b. The second light emitting device 140 may include a 2-1th light emitting device 140a disposed in the 2-1th sub-pixel SP2a and a 2-2th light emitting device 140b disposed in the 2-2th sub-pixel SP2b. The third light emitting device 150 may include a 3-1th light emitting device 150a disposed in the 3-1th sub-pixel SP3a and a 3-2th light emitting device 150b disposed in the 3-2th sub-pixel SP3b.

The second electrode CE2 may be disposed in each of the plurality of sub-pixels. The second electrode CE2 may be disposed on the light emitting device ED. The second electrode CE2 may be electrically connected to the pixel driving circuit PD (showed in FIG. 3) through a plurality of contact electrodes CCE. The second electrode CE2 may be electrically connected to the cathode 135 (showed in FIG. 9) of the light emitting device ED to transmit the cathode voltage from the pixel driving circuit PD (showed in FIG. 3) to the light emitting device ED. The cathode voltage applied to the second electrode CE2 of each of the plurality of sub-pixels may be the same. In addition, the cathode voltage applied to the second electrode CE2 of each of the plurality of sub-pixels may be changed according to a reference voltage Vref (showed in FIG. 4).

The second electrode CE2 may have a size corresponding to one row (or horizontal line). For example, the second electrode CE2 may have a width corresponding to one row (or horizontal line) and may extend along the column direction (or the first direction X). In addition, the second electrode CE2 may be commonly connected to the light emitting device ED in each of the plurality of first pixels PX1 arranged along the column direction (or the first direction X). In addition, some of the second electrodes CE2 of each of the plurality of sub-pixels may be separated from each other.

The plurality of second electrodes CE2 may be formed of a transparent conductive material, but embodiments of the present disclosure are not limited thereto. The plurality of second electrodes CE2 may be formed of the transparent conductive material so that light emitted from the light emitting device ED is directed to an upper portion of the second electrode CE2. For example, the second electrode CE2 may be formed of the transparent conductive material such as indium tin oxide (ITO), indium zinc oxide (IZO), indium gallium zinc oxide (IGZO), or the like, but embodiments of the present disclosure are not limited thereto.

A plurality of contact electrodes CCE may be disposed on the substrate 110. For example, the plurality of contact electrodes CCE may be spaced apart from the plurality of banks BNK and the plurality of signal lines TL. Each of the plurality of second electrodes CE2 may overlap at least one contact electrode CCE. The plurality of contact electrodes CCE may transmit the cathode voltage from the pixel driving circuit PD (showed in FIG. 3) to the second electrode CE2.

When the light emitting device ED is formed of a micro light emitting diode chip, the micro light emitting diode chip may be transferred to the substrate 110 to manufacture the display panel 100. Various defects may occur in the process of transferring the plurality of light emitting devices ED having a micro size from the wafer to the substrate 110. In consideration of defects occurring during the transfer process of the plurality of light emitting devices ED, a plurality of the same type of light emitting devices ED may be transferred to one sub-pixel. In this case, a lighting test of the plurality of light emitting devices ED is performed, and only one light emitting device ED that has finally been determined to be normal may be used. That is, even if the plurality of the same type of light emitting devices ED are transferred to one first pixel PX1, only one light emitting device ED may be finally used. In this case, any one of the pair of light emitting devices ED may be a main or primary light emitting device ED, and the other light emitting device ED may be a redundancy light emitting device ED. The redundancy light emitting device ED may be an extra light emitting device ED transferred to prepare for a defect in the main light emitting device ED.

Figure 8:
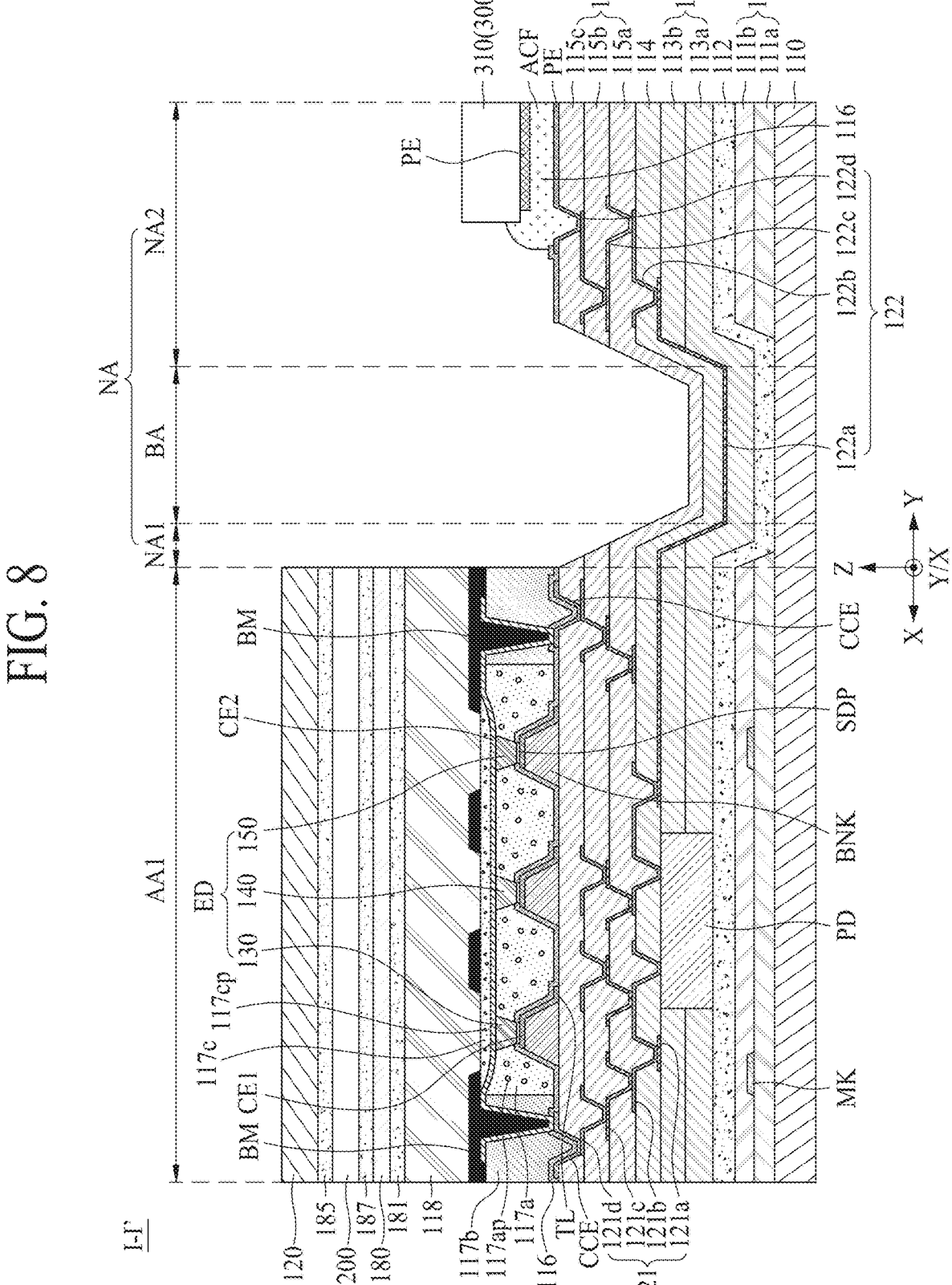
FIG. 8 is a cross-sectional view of a display device according to an embodiment of the present disclosure.
Figure 9:
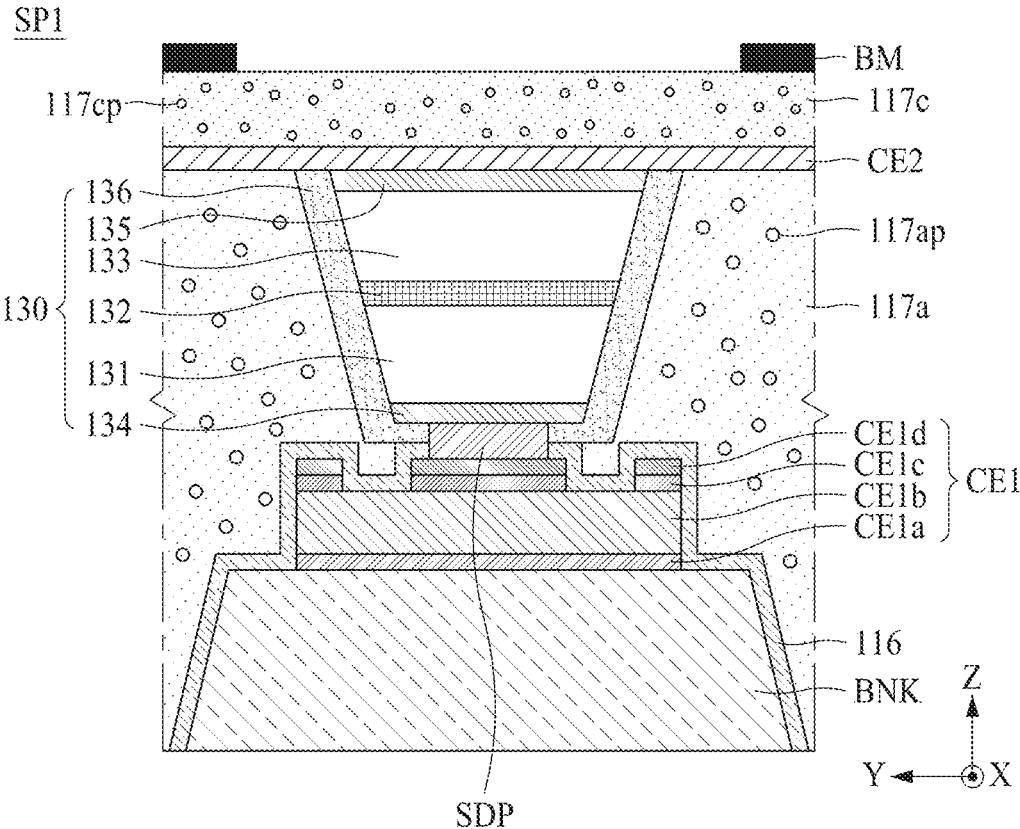
FIG. 9 is a cross-sectional view of a display device according to an embodiment of the present disclosure.

FIG. 8 is a cross-sectional view of a display device according to an embodiment of the present disclosure. FIG. 9 is a cross-sectional view of a display device according to an embodiment of the present disclosure. For example, FIG. 8 is a cross-sectional view of the first display area AA1, the first non-display area NA1, the bending area BA, and the second non-display area NA2, and FIG. 9 is a cross-sectional view of a portion of the first display area AA1.

Referring to FIG. 8, a buffer layer 111 is disposed on the substrate 110. The buffer layer 111 includes a first buffer layer 111a and a second buffer layer 111b. The first buffer layer 111a and the second buffer layer 111b may be disposed in the first display area AA1, the first non-display area NA1, and the second non-display area NA2. An upper surface of the substrate 110 disposed in the bending area BA may be exposed by the first buffer layer 111a and the second buffer layer 111b. Accordingly, cracks generated in the first buffer layer 111a and the second buffer layer 111b may be prevented or minimized when the bending area BA is bent. The first buffer layer 111a and the second buffer layer 111b may be formed of an inorganic insulating material. The first buffer layer 111a and the second buffer layer 111b may reduce penetration of moisture or impurities through the substrate 110.

A plurality of alignment keys MK may be disposed between the first buffer layer 111a and the second buffer layer 111b. The plurality of alignment keys MK may identify a position of the pixel driving circuit PD during a manufacturing process of the display panel 100. The plurality of alignment keys MK may be omitted.

An adhesive layer 112 may be disposed on the second buffer layer 111b. The adhesive layer 112 may be disposed in the first display area AA1, the first non-display area NA1, the bending area BA, and the second non-display area NA2. In addition, a portion of the adhesive layer 112 may be removed from the non-display area NA including the bending area BA.

In the display area AA, the pixel driving circuit PD may be disposed on the adhesive layer 112. The driving circuit PD may be supported by the buffer layer 111.

A protective layer 113 may be disposed on the adhesive layer 112 and the pixel driving circuit PD. The protective layer 113 may include a first protective layer 113a and a second protective layer 113b. The first protective layer 113a and the second protective layer 113b may be formed of an organic insulating material, but embodiments of the present disclosure are not limited thereto.

A wiring layer may be disposed on the protective layer 113b. The wiring layer may surround or cover the pixel driving circuit PD. The wiring layer may include a plurality of first connection lines 121.

The plurality of first connection lines 121 may be disposed on the second protective layer 113b. The plurality of first connection lines 121 may electrically connect the pixel driving circuit PD to wirings in other components or different layers. For example, the pixel driving circuit PD may be electrically connected to the plurality of signal lines TL, the plurality of contact electrodes CCE, and the like through the plurality of first connection lines 121. The plurality of first connection lines 121 may include a plurality of 1-1th connection lines 121a, a plurality of 1-2th connection lines 121b, a plurality of 1-3th connection lines 121c, and a plurality of 1-4th connection lines 121d.

The plurality of 1-1th connection lines 121a may be disposed on the second protective layer 113b. The plurality of 1-1th connection lines 121a may transmit voltages output from the pixel driving circuit PD to the first electrode CE1 or the second electrode CE2.

A third protective layer 114 may be disposed on the second protective layer 113b. The third protective layer 114 may be disposed on the entire first display area AA1 and the non-display area NA.

The plurality of 1-2th connection lines 121b may be disposed on the third protective layer 114. The plurality of 1-2th connection lines 121b may be connected to the pixel driving circuit PD through the 1-1th connection lines 121a or may be directly connected to the pixel driving circuit PD.

The display device 1000 may further include an insulating layer 115 on the wiring layer. The insulating layer 115 may electrically insulate the plurality of first connection lines 121 from each other and may cover the plurality of first connection lines 121. The insulating layer 115 may include a first insulating layer 115a, a second insulating layer 115b and a third insulating layer 115c.

A first insulating layer 115a may be disposed on the plurality of 1-2th connection lines 121b. The first insulating layer 115a may be disposed in the entire display area AA and the non-display area NA, but embodiments of the present disclosure are not limited thereto. The first insulating layer 115a may be formed of an organic insulating material, but embodiments of the present disclosure are not limited thereto.

The plurality of 1-3th connection lines 121c may be disposed on the first insulating layer 115a. The plurality of 1-3th connection lines 121*c* may be electrically connected to the plurality of 1-2th connection lines 121*b*.

A second insulating layer 115*b* may be disposed on the plurality of 1-3th connection lines 121*c*. The second insulating layer 115*b* may be disposed in the remaining area except for the bending area BA, but embodiments of the present disclosure are not limited thereto.

The plurality of 1-4th connection lines 121*d* may be disposed on the second insulating layer 115*b*. The plurality of 1-4th connection lines 121*d* may be electrically connected to the plurality of 1-3th connection lines 121*c*.

The 1-4th connection line 121*d* may be connected to the contact electrode CCE through a contact hole of the third insulating layer 115*c*. Accordingly, the contact electrode CCE may be electrically connected to the pixel driving circuit PD by the first connection wiring 121. In addition, the 1-4th connection wiring 121*d* may be electrically connected to the signal line TL. Accordingly, the signal line TL may be electrically connected to the pixel driving circuit PD by the first connection line 121.

A plurality of second connection lines 122 may be disposed on the second protective layer 113*b* in the non-display area NA. The plurality of second connection lines 122 may transmit a signal received from the flexible circuit board 310 (showed in FIG. 2) and a printed circuit board 330 (showed in FIG. 2) to the pixel driving circuit PD of the display area AA.

The plurality of second connection lines 122 may extend from the pad part PAD (showed in FIG. 2) toward the display area AA to transmit signals to the wirings of the display area AA. In this case, the plurality of second connection lines 122 may function as link lines LL (showed in FIG. 3). The plurality of second connection lines 122 may include a 2-1th connection line 122*a*, a 2-2th connection line 122*b*, a 2-3th connection line 122*c*, and a 2-4th connection line 122*d*. A signal received from the flexible circuit board 310 (showed in FIG. 2) and the printed circuit board 330 (showed in FIG. 2) may be transmitted to the 2-1th connection line 122*a* through the 2-4th connection line 122*d*, the 2-3th connection line 122*c*, and the 2-2th connection line 122*b*.

The plurality of first connection lines 121 and the plurality of second connection lines 122 may be formed of a conductive material having excellent ductility or various conductive materials used in the display area AA.

A third insulating layer 115*c* may be disposed on the plurality of first connection lines 121 and the plurality of second connection lines 122. The third insulating layer 115*c* may be disposed in the first display area AA1, the first non-display area NA1, and the second non-display area NA2. At least a portion of the third insulating layer 115*c* in the bending area BA may be removed. The third insulating layer 115*c* may be formed of an organic insulating material, but embodiments of the present disclosure are not limited thereto.

A plurality of banks BNK may be disposed on the third insulating layer 115*c* in the first display area AA1. The plurality of banks BNK may overlap each of the plurality of sub-pixels. One or more light emitting devices ED of the same type may be disposed on an upper portion of each of the plurality of banks BNK.

In the first display area AA1, a plurality of signal lines TL may be disposed on the third insulating layer 115*c*. The plurality of signal lines TL may be disposed between the plurality of banks BNK. Each of the plurality of signal lines TL may be electrically connected to the first connection line 121, for example, the 1-4th connection line 121*d*.

A plurality of contact electrodes CCE may be disposed on the third insulating layer 115*c* in the first display area AA1. The plurality of contact electrodes CCE may supply the cathode voltage from the pixel driving circuit PD to the second electrode CE2. Each of the plurality of contact electrodes CCE may be electrically connected to the first connection line 121, for example, the 1-4th connection line 121*d*.

A first electrode CE1 may be disposed on the bank BNK. The first electrode CE1 may extend from the adjacent signal line TL to an upper portion of the bank BNK. The first electrode CE1 may be disposed on an upper surface of the bank BNK and a side surface of the bank BNK. The first electrode CE1 may be a contact electrode. In addition, the first electrode CE1 may be integrally formed with the signal line TL.

Referring to FIG. 9, the first electrode CE1 may include a plurality of conductive layers. For example, the first electrode CE1 may include a first conductive layer CE1*a*, a second conductive layer CE1*b*, a third conductive layer CE1*c*, and a fourth conductive layer CE1*d*, but embodiments of the present disclosure are not limited thereto.

The first conductive layer CE1*a* may be disposed on the bank BNK. The second conductive layer CE1*b* may be disposed on the first conductive layer CE1*a*. The third conductive layer CE1*c* may be disposed on the second conductive layer CE1*b*, and the fourth conductive layer CE1*d* may be disposed on the third conductive layer CE1*c*. The first conductive layer CE1*a*, the second conductive layer CE1*b*, the third conductive layer CE1*c*, and the fourth conductive layer CE1*d* may be formed of titanium (Ti), molybdenum (Mo), aluminum (Al), or titanium (Ti) and indium tin oxide (ITO), but embodiments of the present disclosure are not limited thereto.

A solder pattern SDP may be disposed on the first electrode CE1 in each of the plurality of sub-pixels. The solder pattern SDP may bond the light emitting device ED to the first electrode CE1. The first electrode CE1 and the light emitting device ED may be electrically connected to each other through eutectic bonding using the solder pattern SDP, but embodiments of the present disclosure are not limited thereto.

A passivation layer 116 may be disposed on the wiring layer. The passivation layer 116 may be disposed on the plurality of signal lines TL, the plurality of first electrodes CE1, the plurality of contact electrodes CCE, and the third insulation layer 115*c*. Since the passivation layer 116 covers the remaining areas while exposing at least a portion of the plurality of pad electrodes PE, the plurality of contact electrodes CCE, and the solder pattern SDP, penetration of moisture or impurities flowing into the light emitting device ED may be reduced. The passivation layer 116 may be formed of a single layer or multiple layers including silicon oxide (SiOx) or silicon nitride (SiNx), but embodiments of the present disclosure are not limited thereto.

In each of the plurality of sub-pixels, the light emitting device ED may be disposed on the solder pattern SDP. The first light emitting device 130 may be disposed in the first sub-pixel SP1. The second light emitting device 140 may be disposed in the second sub-pixel SP2. The third light emitting device 150 may be disposed in the third sub-pixel SP3.

Referring to FIG. 9, the first light emitting device 130 may include an anode 134, a first semiconductor layer 131, an active layer 132, a second semiconductor layer 133, a cathode 135, and an encapsulation layer 136, but embodiments of the present disclosure are not limited thereto. For example, the encapsulation layer 136 may not be included in the first light emitting device 130.

The first semiconductor layer 131 may be disposed on the solder pattern SDP. The second semiconductor layer 133 may be disposed on the first semiconductor layer 131.

For example, one of the first semiconductor layer 131 and the second semiconductor layer 133 may include a compound semiconductor such as a group III-V or a group II-VI, and may be doped with impurities (or dopants). For example, one of the first semiconductor layer 131 and the second semiconductor layer 133 may be a semiconductor layer doped with n-type impurities, and the other may be a semiconductor layer doped with p-type impurities, but embodiments of the present disclosure are not limited thereto. Each of the first semiconductor layer 131 and the second semiconductor layer 133 may be a nitride semiconductor including an n-type impurity and a nitride semiconductor including a p-type impurity, but is not limited thereto.

At least one of the first semiconductor layer 131 and the second semiconductor layer 133 may be a layer in which an n-type or p-type impurity is doped into a material such as gallium nitride (GaN), gallium phosphide (GaP), gallium arsenic phosphide (GaAsP), aluminum gallium indium phosphide (AlGaInP), indium aluminum phosphide (InAlP), aluminum gallium nitride (AlGaN), aluminum indium nitride (AlInN), aluminum gallium nitride (AlInGaN), aluminum gallium arsenic (AlGaAs), gallium arsenic (Al-GaAs), or a material such as gallium arsenic (GaAs), but embodiments of the present disclosure are not limited thereto. For example, the n-type impurity may be silicon (Si), germanium (Ge), selenium (Se), carbon (C), tellurium (Te), tin (Sn), or the like, but embodiments of the present disclosure are not limited thereto. For example, the p-type impurity may be magnesium (Mg), zinc (Zn), calcium (Ca), strontium (Sr), barium (Ba), beryllium (Be), or the like, but embodiments of the present disclosure are not limited thereto.

The active layer 132 may be disposed between the first semiconductor layer 131 and the second semiconductor layer 133. The active layer 132 may emit light by receiving holes and electrons from the first semiconductor layer 131 and the second semiconductor layer 133. For example, the active layer 132 may be formed of one of a single well structure, a multi-well structure, a single quantum well structure, a multi-quantum well (MQW) structure, a quantum dot structure, and a quantum line structure, but embodiments of the present disclosure are not limited thereto.

The anode 134 may be disposed between the first semiconductor layer 131 and the solder pattern SDP. For example, the anode 134 may electrically connect the first semiconductor layer 131 to the first electrode CE1. The anode voltage output from the pixel driving circuit PD may be applied to the first semiconductor layer 131 through the signal line TL, the first electrode CE1, and the anode 134. For example, the anode 134 may be formed of a conductive material capable of eutectic bonding with the solder pattern SDP, but embodiments of the present disclosure are not limited thereto. For example, the anode 134 may be formed of gold (Au), tin (Sn), tungsten (W), silicon (Si), silicon (Ag), titanium (Ti), iridium (Ir), chromium (In), indium (Zn), zinc (Pb), lead (Ni), platinum (Pt), copper (Cu), or alloys thereof, but embodiments of the present disclosure are not limited thereto.

The cathode 135 may be disposed on the second semiconductor layer 133. For example, the cathode 135 may electrically connect the second semiconductor layer 133 to the second electrode CE2. The cathode voltage output from the pixel driving circuit PD may be applied to the second semiconductor layer 133 through the contact electrode CCE, the second electrode CE2, and the cathode 135. The cathode 135 may be formed of a transparent conductive material to allow light emitted from the light emitting device ED to be directed to an upper portion of the light emitting device ED, but embodiments of the present are not limited thereto.

The encapsulation layer 136 may be disposed on at least a portion of each of the first semiconductor layer 131, the active layer 132, the second semiconductor layer 133, the anode 134, and the cathode 135. The encapsulation layer 136 may protect the first semiconductor layer 131, the active layer 132, and the second semiconductor layer 133.

According to the present disclosure, the light emitting device ED has been described as a vertical structure, but embodiments of the present disclosure are not limited thereto. For example, the light emitting device ED may have a lateral structure or a flip chip structure.

Although the first light emitting device 130 has been described with reference to FIG. 9, the second light emitting device 140 and the third light emitting device 150 may have substantially the same structure as the first light emitting device 130. For example, the second light emitting device 140 and the third light emitting device 150 may have substantially the same configuration as the first semiconductor layer 131, the active layer 132, the second semiconductor layer 133, the anode 134, the cathode 135, and the encapsulation layer 136.

As shown in FIGS. 8 and 9, the display device 1000 may further include optical layers 117a, 117b and 117c.

The optical layers 117a, 117b and 117c may surround the plurality of light emitting devices ED in the first display area AA1. For example, the optical layers 117a, 117b and 117c may be configured to cover the plurality of light emitting devices ED in the first display area AA1.

A first optical layer 117a may cover side surfaces of the plurality of light emitting devices ED and side surfaces of the plurality of banks BNK in the plurality of sub-pixels. In addition, the first optical layer 117a may cover the second electrode CE2, a portion of the passivation layer 116, and an area between the plurality of light emitting devices ED. In addition, the first optical layer 117a may be disposed between the plurality of light emitting devices ED and between the plurality of banks BNK included in one first pixel PX1.

The first optical layer 117a may include an organic insulating material in which fine particles are distributed. For example, the first optical layer 117a may be formed of siloxane in which fine metal particles such as titanium dioxide (TiO$_2$) particles are distributed, but embodiments of the present distributed are not limited thereto. Light from the plurality of light emitting devices ED may be scattered by fine particles distributed in the first optical layer 117a and emitted to an outside of the display panel 100. Accordingly, the first optical layer 117a may improve extraction efficiency of light emitted from the plurality of light emitting devices ED.

The second optical layer 117b may be disposed on the passivation layer 116 in the first display area AA1. The second optical layer 117b may surround the first optical layer 117a. In addition, the second optical layer 117b may be in contact with a side surface of the first optical layer 117a. In addition, the second optical layer 117b may be disposed in an area between the plurality of pixels PX, but embodiments of the present disclosure are not limited thereto.

The second optical layer 117b may be formed of an organic insulating material. The second optical layer 117b may be formed of the same material as the first optical layer 117*a*, but embodiments of the present disclosure are not limited thereto. For example, the first optical layer 117*a* may include fine particles, and the second optical layer 117*b* may not include fine particles.

A thickness of the first optical layer 117*a* may be less than a thickness of the second optical layer 117*b*. An upper surface of the second optical layer 117*b* may be a flat surface, and an upper surface of the first optical layer 117*a* may be a concave curved surface. Accordingly, when viewed in a plan view, an area in which the first optical layer 117*a* is disposed may include a concave portion recessed from the upper surface of the second optical layer 117*b*.

The second electrode CE2 may be disposed on the first optical layer 117*a* and the second optical layer 117*b*. The second electrode CE2 may overlap the entire first optical layer 117*a* and may overlap a portion of the second optical layer 117*b*.

The second electrode CE2 may be disposed on the plurality of light emitting devices ED. In addition, the second electrode CE2 the second electrode CE2 may be in contact with the cathode electrode 135. The second electrode CE2 may be electrically connected to the plurality of contact electrodes CCE through a contact hole of the second optical layer 117*b*. The second electrode CE2 may be commonly connected to the plurality of light emitting devices ED in each of the plurality of first pixels PX1 arranged along the row direction (or the first direction X) of the substrate 110.

The second electrode CE2 may continuously extend on the first optical layer 117*a*, the second optical layer 117*b*, and the light emitting device ED. The area in which the first optical layer 117*a* is disposed may include the concave portion recessed from the upper surface of the second optical layer 117*b*. Accordingly, since a first portion of the second electrode CE2 disposed on the first optical layer 117*a* is disposed along the concave portion, the first portion may be disposed at a lower position than a second portion of the second electrode CE2 disposed on the second optical layer 117*b*.

The third optical layer 117*c* may be disposed on the second electrode CE2. The third optical layer 117*c* may overlap the plurality of light emitting devices ED and the first optical layer 117*a* and may not overlap the second optical layer 117*b*. The third optical layer 117*c* may be formed of an organic insulating material in which fine particles are distributed. For example, the third optical layer 117*c* may be formed of siloxane in which fine metal particles such as titanium dioxide (TiO2) particles are distributed, but embodiments of the present disclosure are not limited thereto. In addition, the third optical layer 117*c* may be formed of the same material as the first optical layer 117*a*, but embodiments of the present disclosure are not limited thereto.

Light from the plurality of light emitting devices ED may be scattered by fine particles 117*cp* distributed in the third optical layer 117*c* and emitted to the outside of the display panel 100. The third optical layer 117*c* may evenly mix the light emitted from the plurality of light emitting devices ED to further improve luminance uniformity of the display device. In addition, light extraction efficiency of the display device may be improved by the light scattered from the plurality of fine particles 117*cp*, and thus the display device may be driven at a low power.

In the first display area AA1, a black matrix BM may be disposed on the second electrode CE2, the first optical layer 117*a*, the second optical layer 117*b*, and the third optical layer 117*c*. The black matrix BM may fill a contact hole of the second optical layer 117*b*. In addition, since the black matrix BM is disposed within a contact hole in which the second electrode CE2 and the contact electrode CCE are connected, light leakage between the plurality of adjacent sub-pixels may be prevented or at least reduced. The black matrix BM may be an organic insulating material to which a black pigment or a black dye is added, but embodiments of the present disclosure are not limited thereto.

The display device 1000 may further include a cover layer 118. The cover layer 118 may cover the first display area AA1 and may protect the plurality of light emitting devices ED. The cover layer 118 may be formed of organic insulating material, but embodiments of the present disclosure are not limited thereto.

A polarizing layer 180 may be disposed on the cover layer 118 via a first adhesive layer 181. A cover member 120 may be disposed on the polarizing layer 180 via a second adhesive layer 185. The polarizing layer 180 may be attached to a rear surface of a touch panel 200 via a third adhesive layer 187. The touch panel 200 may be attached to a rear surface of the cover member 120 via the second adhesive layer 185.

The plurality of pad electrodes PE may be disposed on the third insulating layer 115*c* in the second non-display area NA2. In addition, an adhesive film ACF may be disposed between the plurality of pad electrodes PE and the flexible circuit board 170 to attach or bond the flexible circuit board 310 to the plurality of pad electrodes PE.

The flexible circuit board 310 may be disposed on the adhesive film ACF. The flexible circuit board 310 may be electrically connected to the plurality of pad electrodes PE through the adhesive film ACF. The signals output from the printed circuit board 330 may be transmitted to the pixel driving circuit PD of the display area AA through the flexible circuit board 310, the plurality of pad electrodes PE, the 2-4th connection line 122*d*, the 2-3th connection line 122*c*, the 2-1th connection line 122*b*, and the 2-1th connection line 122*a*.

Figure 10:
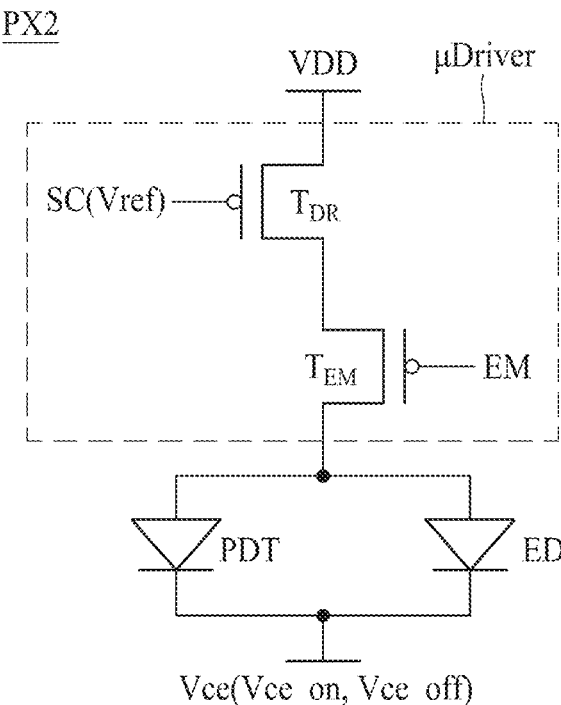
FIG. 10 is a diagram illustrating a circuit of a second pixel according to an embodiment of the present disclosure.

FIG. 10 is a diagram illustrating a circuit of a second pixel PX2 according to an embodiment of the present disclosure. Compared with the circuit of the first pixel PX1 illustrated in FIG. 4, the second pixel PX2 illustrated in FIG. 10 includes the same configuration as the first pixel PX1 except for the photo detector PDT, so the description of the same configuration will be omitted.

Referring to FIG. 10, the second pixel PX2 may further include a photo detector PDT.

A first electrode of the photo detector PDT may be connected to a second electrode of the light emitting transistor $T_{EM}$, and a second electrode of the photo detector PDT may be connected to a low-potential power line. For example, the first electrode of the photo detector PDT may be an anode, and the second electrode of the photo detector PDT may be a cathode electrode, but the present disclosure is not limited thereto.

FIG. 10 discloses that the first electrode of the photo detector PDT is connected to the first electrode of the light emitting device ED, and the second electrode of the photo detector PDT is connected to the second electrode of the light emitting device ED, but are not limited thereto. For example, the second pixel PX2 further includes an additional transistor, and the first electrode of the photo detector PDT and the first electrode of the light emitting device ED may be connected to different transistors. In addition, the second electrode of the photo detector PDT and the second electrode of the light emitting device ED may receive different voltages from each other.

Figure 11:
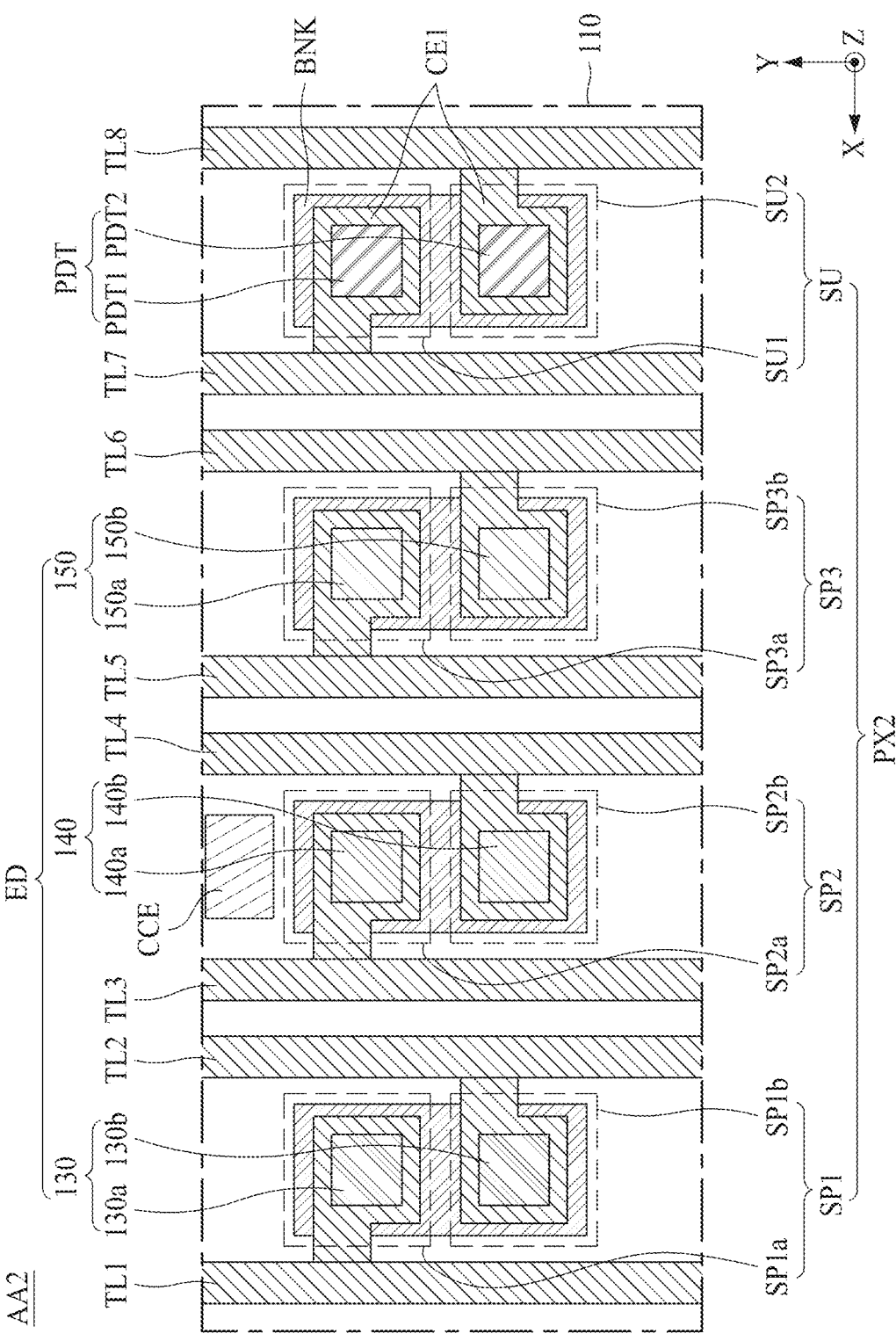
FIG. 11 is a plan view of a second display area of a display device according to an embodiment of the present disclosure.

FIG. 11 is a plan view of a second display area AA2 of a display device according to an embodiment of the present disclosure. Specifically, FIG. 11 is an enlarged view of a second display area AA2 including one second pixel PX2. Compared with a plan view of the first pixel PX1 shown in FIG. 6, the second pixel PX2 shown in FIG. 11 includes the same configuration as the first pixel PX1 except for the sensing unit SU, and thus the description of the same configuration will be omitted.

Referring to FIG. 11, compared to the plurality of first pixels PX1, each of the plurality of second pixels PX2 may further include one or more sensing units SU. Each of the plurality of second pixels PX2 may include a pair of sensing units SU. The pair of sensing units SU may include a first sensing unit SU1 and a second sensing unit SU2. Although FIG. 11 shows that the sensing unit SU is disposed at one side of the third sub-pixel SP3, but the present disclosure is not limited thereto.

As described above in FIG. 6, the plurality of signal lines TL may be disposed in a region between the plurality of sub-pixels. The plurality of signal lines TL may further include a seventh signal line TL7 and an eighth signal line TL8. Each of the seventh signal line TL7 and the eighth signal line TL8 may be electrically connected to each of the pair of sensing units SU.

The seventh signal line TL7 may be disposed at one side of the pair of sensing units SU, and the eighth signal line TL8 may be disposed at the other side of the pair of sensing units SU. For example, the seventh signal line TL7 may be disposed adjacent to the sixth signal line TL6. The eighth signal line TL8 may be disposed adjacent to the first signal line TL1 connected to the adjacent second pixel PX2.

The seventh signal line TL7 may be electrically connected to the first electrode CE1 of one of the pair of sensing units SU, and the eighth signal line TL8 may be electrically connected to the first electrode CE1 of the remaining sensing unit SU. For example, the seventh signal line TL7 may be electrically connected to the first electrode CE1 of the first sensing unit SU1, and the eighth signal line TL8 may be electrically connected to the first electrode CE1 of the second sensing unit SU2.

Like the first to third sub-pixels SP1 to SP3, a bank BNK may be disposed in each sensing unit SU. Like the plurality of light emitting devices ED, a plurality of banks BNK may guide a position of the plurality of photo detectors PDT in a transfer process that transfers the plurality of photo detectors PDT.

Like the plurality of light emitting devices ED, the plurality of photo detectors PDT may be disposed on the plurality of banks BNK. Each of the plurality of light emitting devices ED and the plurality of photo detectors PDT may be disposed on the bank BNK having the same height. That is, each of the plurality of light emitting devices ED and the plurality of photo detectors PDT may be disposed on the same plane. Accordingly, even if the plurality of photo detectors PDT are formed, an increase in a thickness of the display device may be prevented.

Furthermore, since the plurality of photo detectors PDT are photoelectric conversion elements such as a p-n type photodiode or a pin-type photodiode, the plurality of photo detectors PDT may occupy a relatively small area. Accordingly, even if the plurality of photo detectors PDT are formed, reduction in transmittance and aperture ratio of the display device may be minimized. Therefore, by improving efficiency of the display device, power consumption may be reduced, and the display device may be driven with low power.

The bank BNK of the first to third sub-pixels SP1 to SP3 and the bank BNK of the sensing unit SU may be spaced apart from each other along the row direction (or the second direction Y). In addition, the bank BNK of the first to third sub-pixels SP1 to SP3 and the bank BNK of the sensing unit SU may be separated from each other. Like the first to third sub-pixels SP1 to SP3, the bank BNK of the first sensing unit SU1 and the bank BNK of the second sensing unit SU2 may be connected to each other or may be spaced apart from each other.

A first electrode CE1 may be disposed in the sensing unit SU. Like the first to third sub-pixels SP1-SP3, a part of the first electrode CE1 of the first sensing unit SU1 may extend to one side of the first sensing unit SU1 to be electrically connected to the seventh signal line TL7, and a part of the first electrode CE1 of the second sensing unit SU2 may extend to the other side of the second sensing unit SU2 to be electrically connected to the eighth signal line TL8.

The first electrode CE1 may be electrically connected to the anode of the light emitting device ED and the anode of the photo detector PDT. The anode voltage from the pixel driving circuit may be transferred to the light emitting device ED and the photo detector PDT through the signal line TL and the first electrode CE1.

The plurality of photo detectors PDT may be disposed on the first electrode CE1. The entire area of the plurality of photo detector PDT may overlap the bank BNK and the first electrode CE1. The plurality of photo detectors PDT may overlap the bank BNK and the first electrode CE1 and may contact the first electrode CE1.

The plurality of photo detectors PDT may include a first photo detector PDT1 and a second photo detector PDT2. The first photo detector PDT1 may be disposed in the first sensing unit SU1, and the second photo detector PDT2 may be disposed in the second sensing unit SU2.

A second electrode CE2 may be disposed in each of the plurality of sub-pixels and the sensing unit. The second electrode CE2 may be disposed on the light emitting device ED and the photo detector PDT. The second electrode CE2 may be electrically connected to the pixel driving circuit through a plurality of contact electrodes CCE. The second electrode CE2 may be electrically connected to the cathode of the light emitting device ED and the cathode of the photo detector PDT to transmit the cathode voltage from the pixel driving circuit to the light emitting device ED and the photo detector PDT.

The second electrode CE2 may have a size corresponding to one row (or horizontal line). For example, the second electrode CE2 may be connected in common to the light emitting device ED and the photo detector PDT in each of the plurality of second pixels PX2 disposed along the column direction (or the first direction X).

As described above with reference to FIG. 6, any one of the pair of light emitting devices ED may be the main light emitting device ED and the other light emitting device ED may be the redundancy light emitting device ED. Likewise, any one of the pair of photo detectors PDT may be a main photo detector PDT and the other photo detector ED may be a redundancy photo detector PDT. Accordingly, the main photo detector PDT and the redundancy photo detector PDT may be transferred together to one second pixel PX2, thereby minimizing deterioration of the sensing function due to a defect in the photo detector PDT.

Figure 12:
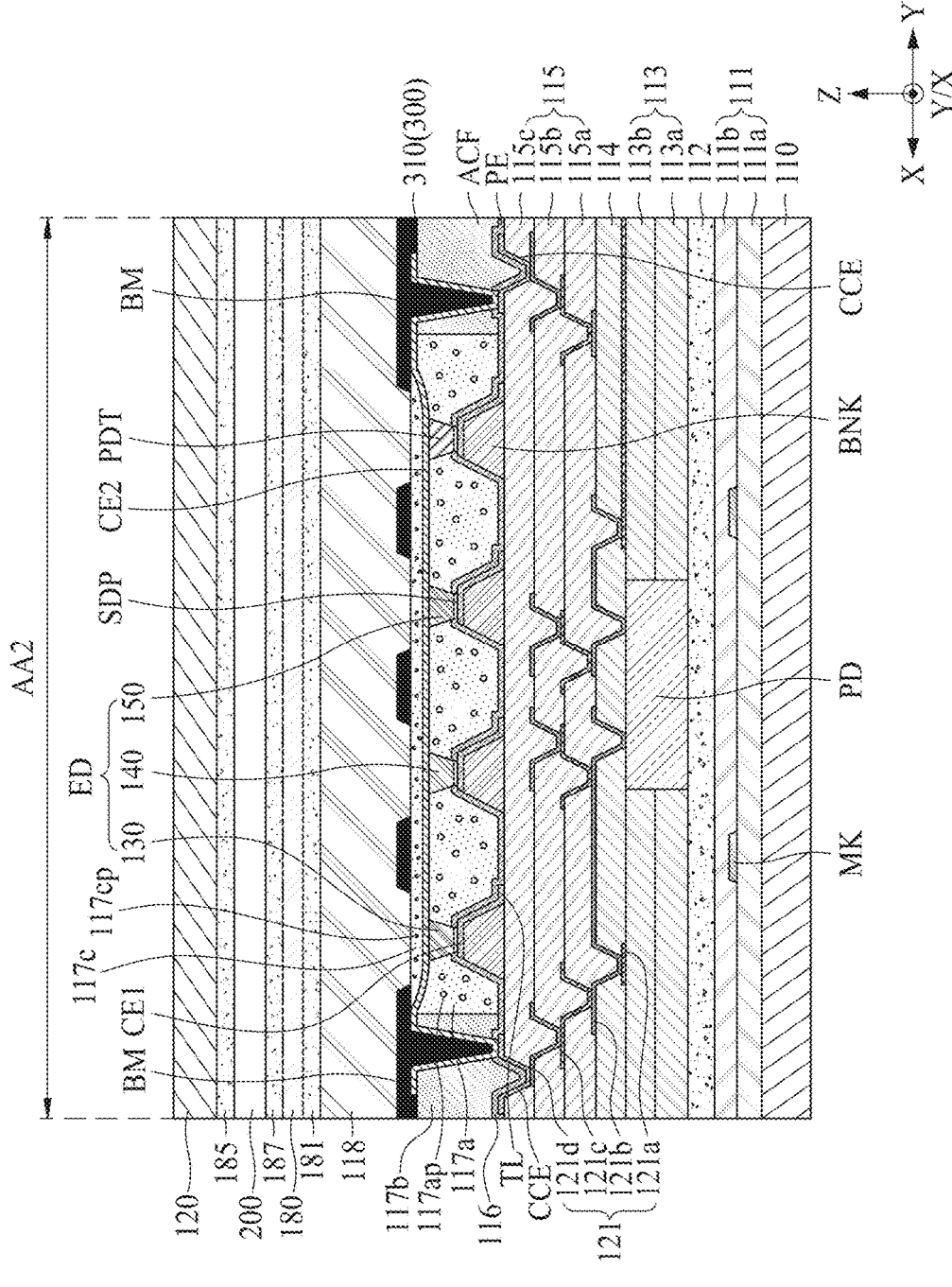
FIG. 12 is a cross-sectional view of a display device according to an embodiment of the present disclosure.
Figure 13:
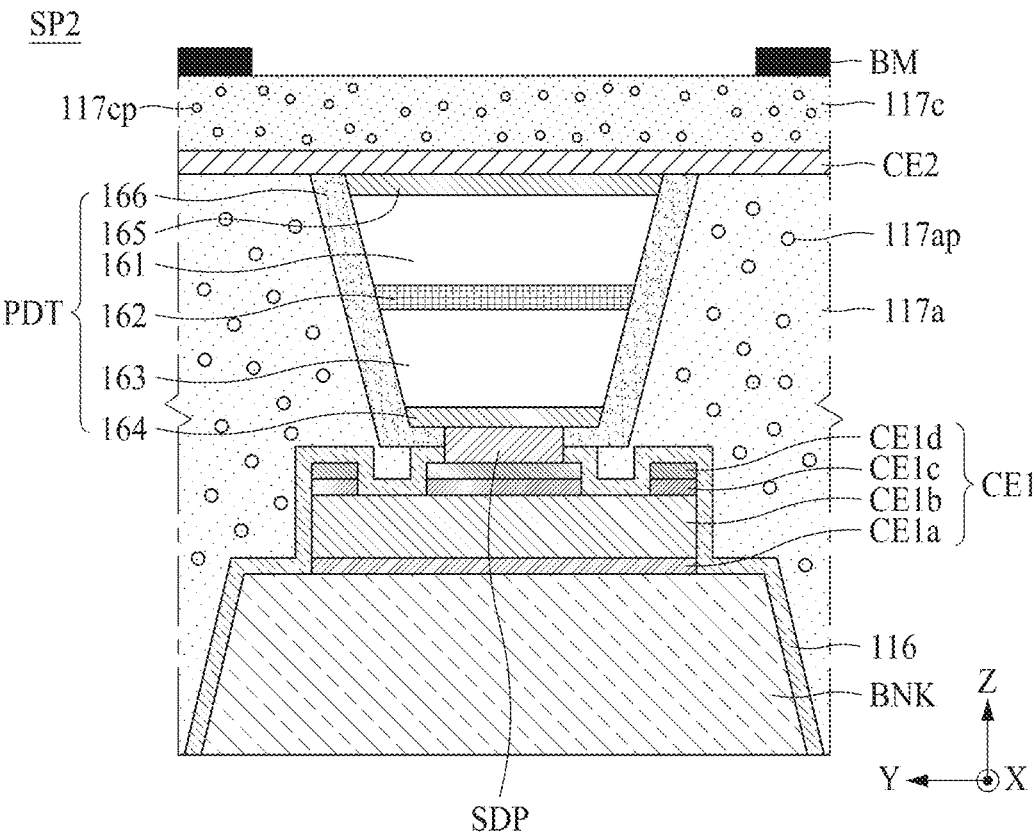
FIG. 13 is a cross-sectional view of a display device according to an embodiment of the present disclosure.
Figure 14:
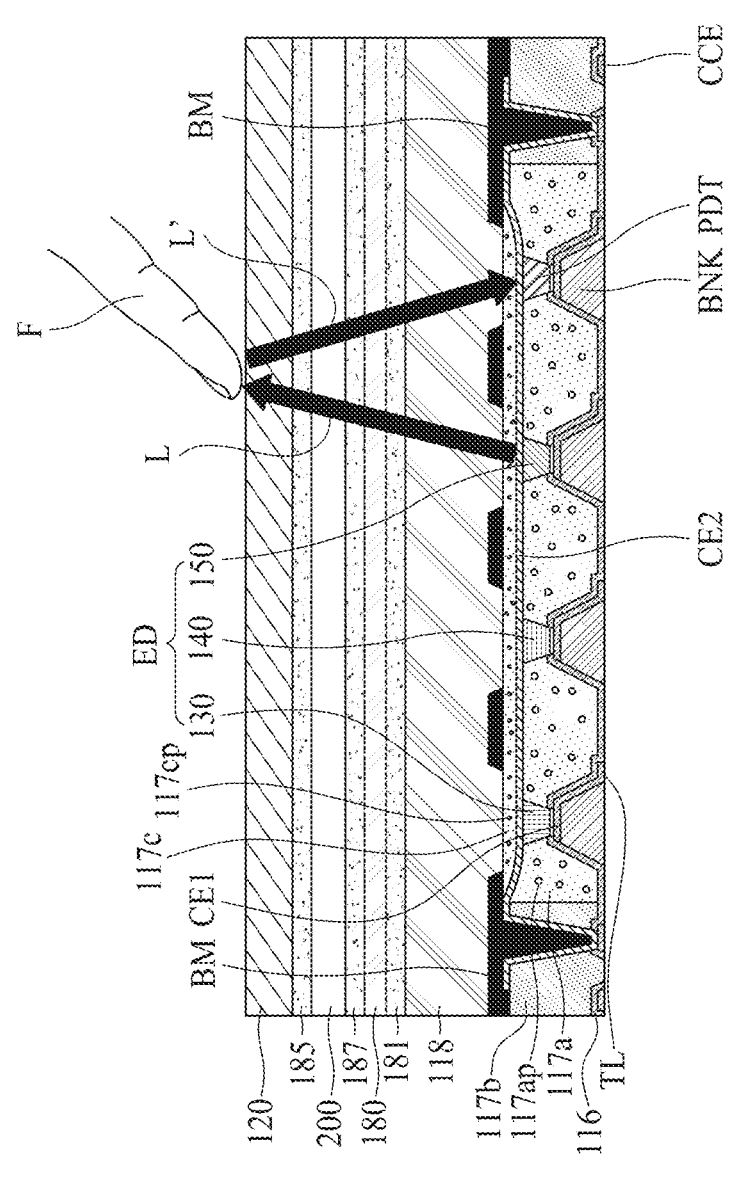
FIG. 14 is a cross-sectional view of a display device according to an embodiment of the present disclosure.

FIGS. 12 to 14 are cross-sectional views of a display device according to an embodiment of the present specification. Specifically, FIG. 12 is a cross-sectional view of a portion of the second display area AA2. Also, FIG. 13 is a cross-sectional view of a photo detector PDT according to an embodiment of the present specification. Also, FIG. 14 illustrates driving of the light emitting device ED and the photo detector PDT.

Compared with the first display area AA1 of the first pixel PX1 illustrated in FIG. 8, the second display area AA2 illustrated in FIG. 12 includes the same configuration as the first display area AA1 except for the photo detector PDT, and thus the description of the same configuration will be omitted.

As described above with reference to FIG. 8, the plurality of banks BNK may be disposed on the third insulating layer 115*c*. The plurality of banks BNK may overlap the plurality of sub-pixels and the sensing unit. The plurality of light emitting devices ED and a plurality of photo detectors PDT may be disposed on an upper portion of each of the plurality of banks BNK.

The light emitting device ED and the photo detector PDT may be disposed on the solder pattern SDP. The anode of the light emitting element ED and the anode of the photo detector PDT may be in contact with the solder pattern SDP. The optical layers 117*a*, 117*b*, and 117*c* may surround the plurality of light emitting devices ED and the photo detector PDT in the second display area AA2. In addition, the optical layers 117*a*, 117*b*, and 117*c* may cover the plurality of light emitting devices ED and the photo detector PDT in the second display area AA2.

As described above in FIG. 9, the first light emitting device 130 may include the anode 134, the first semiconductor layer 131, the active layer 132, the second semiconductor layer 133, the cathode 135, and the encapsulation film 136. The first semiconductor layer 131 of the first light emitting device 130 may be disposed on the solder pattern SDP. In the first light emitting device 130, the second semiconductor layer 133 may be disposed on the first semiconductor layer 131.

Like the first light emitting device 130, the photo detector PDT may include an anode 164, a first semiconductor layer 161, an active layer 162, a second semiconductor layer 163, a cathode 165, and an encapsulation film 166. The second semiconductor layer 163 of the photo detector PDT may be disposed on the solder pattern SDP. In the photo detector PDT, the first semiconductor layer 161 may be disposed on the second semiconductor layer 163.

That is, a stacking order of the first and second semiconductor layers 131 and 133 of the first light emitting device 130 and a stacking order of the first and second semiconductor layers 161 and 163 of the photo detector PDT may be different from each other. As described above, one of the first semiconductor layers 131 and 161 and the second semiconductor layers 133 and 163 may be a semiconductor layer doped with n-type impurities, and the other may be a semiconductor layer doped with p-type impurities. Accordingly, since a direction of a current flowing through the light emitting device ED is different from a direction of a current flowing through the photo detector PDT, the light emitting device ED and the photo detector PDT may be driven differently from each other. Therefore, when the light emitting device ED emits light, the photo detector PDT may receive light.

Referring to FIG. 14, driving of the plurality of light emitting devices ED and the photo detector PDT is illustrated.

When a voltage is supplied to the plurality of light emitting devices ED and the photo detector PDT by the first and second electrodes CE1 and CE2, the plurality of light emitting devices ED may emit light and the photo detector PDT may receive light.

In this case, when a user's finger F is adjacent to or in contact with the display device, a light L emitted from the light emitting device ED may be directed to the user's finger F. The light L emitted from the light emitting device ED may be reflected by the user's finger F. The light L' reflected by the user's finger F may be directed to the photo detector PDT. The photo detector PDT may absorb the light L' reflected by the user's finger F. In addition, the photo detector PDT may convert the absorbed light into an electrical signal. Accordingly, the display device may acquire the user's biometric information through the photo detector PDT. For example, a shape of a fingerprint of the finger may be acquired through the photo detector PDT.

The photo detector PDT may absorb any one of red light, green light, and blue light, but is not limited thereto.

Figure 15:
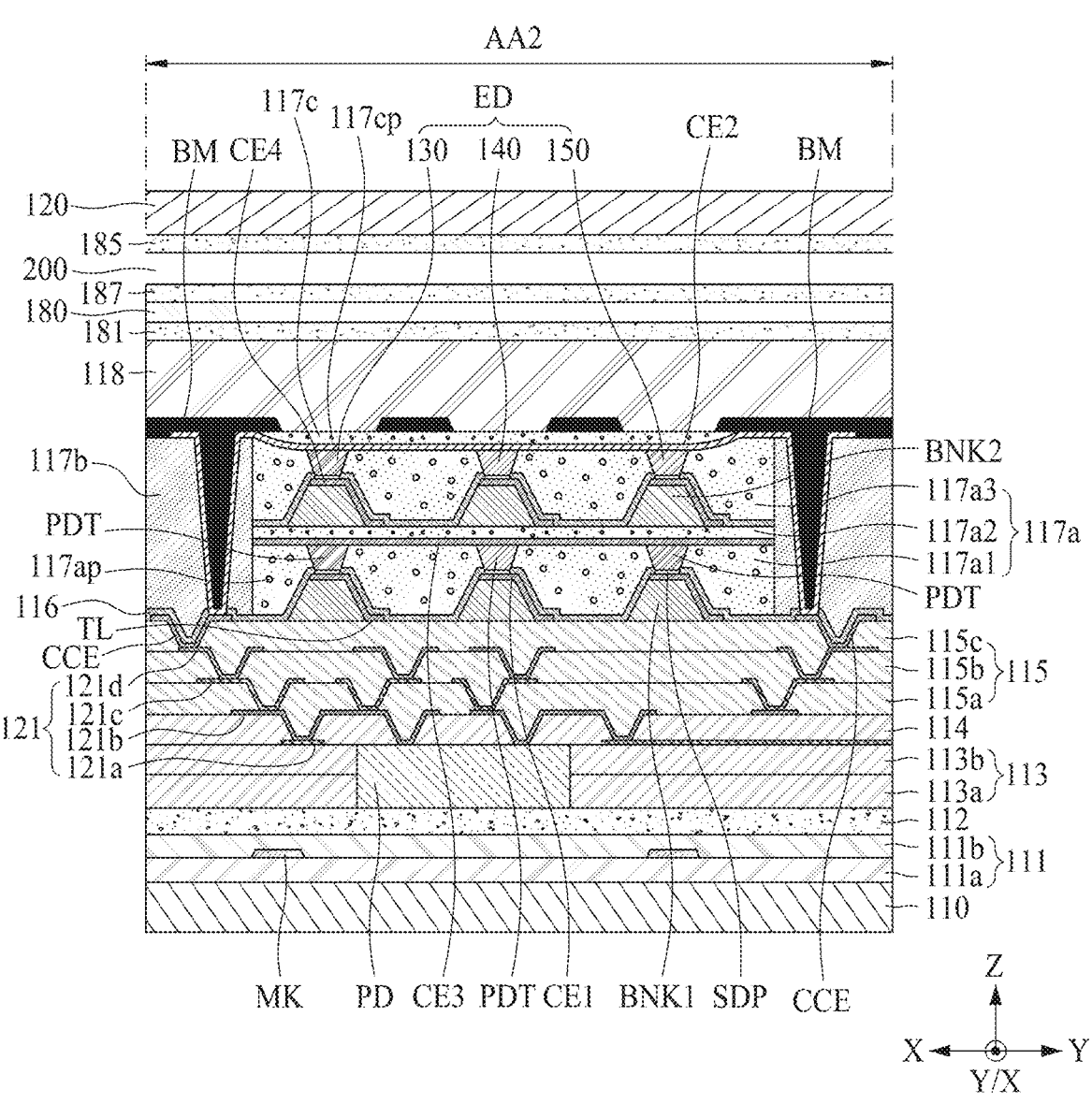
FIG. 15 is a cross-sectional view of a display device according to another embodiment of the present disclosure.

FIG. 15 is a cross-sectional view of a display device according to another embodiment of the present specification. FIG. 14 illustrates that the plurality of light emitting devices and the photo detector are disposed on the same layer, but FIG. 15 illustrates that the plurality of light emitting elements and the photo detector are disposed on different layers.

Referring to FIG. 15, the sensing unit may be disposed under the plurality of sub-pixels. That is, the plurality of photo detector PDT may be disposed under each of the plurality of light emitting devices ED. In addition, the plurality of sub-pixels and the sensing unit may overlap each other. That is, each of the plurality of light emitting devices ED may overlap each of the plurality of photo detectors PDT.

Each of the plurality of photo detectors PDT may be disposed on a first bank BNK1. Each of the plurality of photo detectors PDT may receive an anode voltage output from the pixel driving circuit PD through the first electrode CEL. In addition, each of the plurality of photo detectors PDT may receive a cathode voltage output from the pixel driving circuit PD through the third electrode CE3.

The second bank BNK2 may be disposed on the plurality of photo detectors PDT and may overlap the plurality of photo detectors PDT. Each of the plurality of light emitting devices ED may be disposed on the second bank BNK2. Each of the plurality of light emitting devices ED may receive an anode voltage output from the pixel driving circuit PD through the fourth electrode CE4. Also, each of the plurality of light emitting devices ED may receive a cathode voltage output from the pixel driving circuit PD through the second electrode CE2.

The anode electrodes of the plurality of photo detectors PDT and a plurality of light emitting devices ED may be supplied with the same or different anode voltages. That is, the first electrode CE1 and the fourth electrode CE4 may transmit the same or different anode voltages. In addition, the cathode electrodes of a plurality of photo detectors PDT and the plurality of light emitting devices ED may receive the same or different anode voltages. That is, the second electrode CE2 and the third electrode CE3 may transmit the same or different cathode voltages.

When the plurality of photo detectors PDT and the plurality of light emitting devices ED receive the same anode voltage and the same cathode voltage, the stacking order of the first and second semiconductor layers of each of the plurality of photo detector PDT and the plurality of light emitting devices ED may be different as described above in FIG. 13.

As described above, the optical layers 117a, 117b, and 117c may cover the plurality of light emitting devices ED and the plurality of photo detector PDT. In this case, the first optical layer 117a may include a first lower optical layer 117al, a first central optical layer 117a2, and a first upper optical layer 117a3. The first lower optical layer 117al may be disposed on the passivation layer 116, the first central optical layer 117a2 may be disposed on the first lower optical layer 117al, and the first upper optical layer 117a3 may be disposed on the first central optical layer 117a2.

The first lower optical layer 117al, the first central optical layer 117a2, and the first upper optical layer 117a3 may be formed of the same material, but are not limited thereto.

The first lower optical layer 117al may cover the side surfaces of the plurality of photo detector PDT and the side surfaces of the plurality of first banks BNK1. The third electrode CE3 may be disposed on the first lower optical layer 117a1.

The first central optical layer 117a2 may be disposed on the third electrode CE3, and the second bank BNK2 may be disposed on the first central optical layer 117a2. The first central optical layer 117a2 may cover the third electrode CE3 and a top surface of the first central optical layer 117a2 may be flat.

The first upper optical layer 117a3 may cover the side surfaces of the plurality of light emitting devices ED and the side surfaces of the plurality of second banks BNK2. The upper surface of the first upper optical layer 117a3 may be formed of a concave curved surface. The second electrode CE2 may be disposed on the first upper optical layer 117a3 and the second optical layer 117b.

As described above with reference to FIG. 14, when a voltage is supplied to the plurality of light emitting devices ED and the photo detector PDT by the first to fourth electrodes CE1 to CE4, the plurality of light emitting devices ED may emit light and the photo detector PDT may receive light. In this case, when a user's finger is adjacent to or in contact with the display device, light emitted from the light emitting device ED may be reflected by the user's finger to be directed to the photo detector PDT.

FIG. 14 illustrates one photo detector PDT, but FIG. 15 illustrates photo detectors PDT disposed under each of the plurality of light emitting devices ED. Accordingly, a possibility that the photo detector PDT absorbs the light reflected by the user's finger may be increased. Therefore, the user' biometric information may be acquired more accurately.

The plurality of photo detectors PDT may absorb any one of red light, green light, and blue light, but are not limited thereto. For example, the plurality of photo detectors PDT may absorb light of the same color or light of different colors.

FIGS. 16 to 19 are diagrams illustrating devices to which a display device according to embodiments of the present disclosure is applied.

Figure 16:
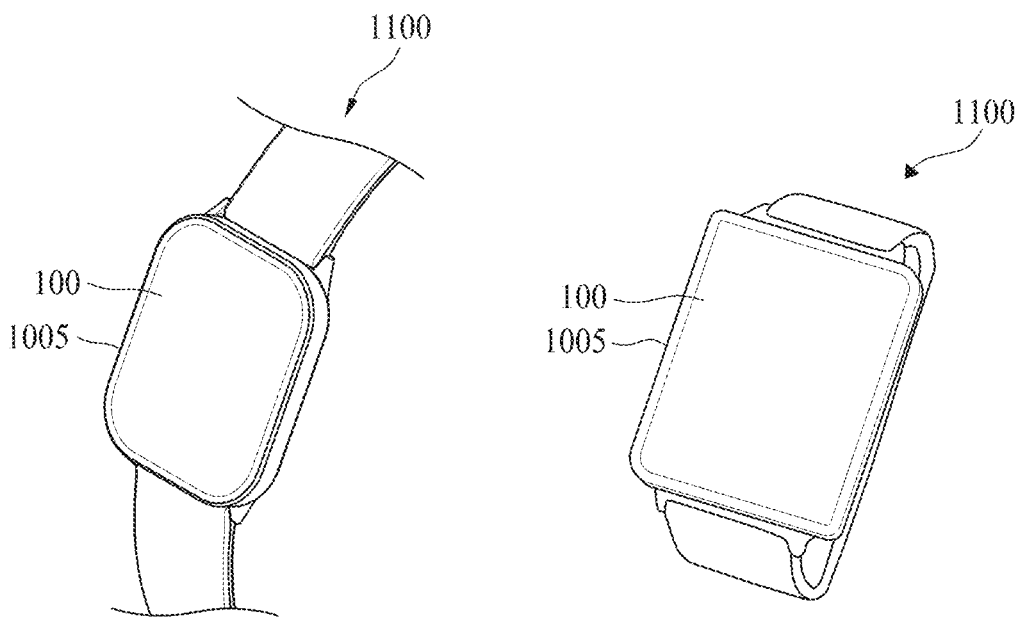
FIGS. 16 to 19 are diagrams illustrating devices to which a display device according to embodiments of the present disclosure is applied.
Figure 17:
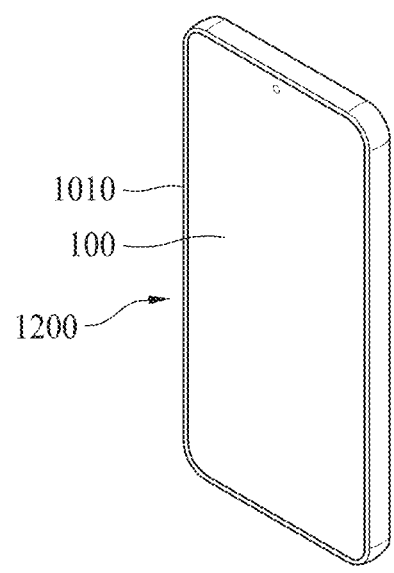
Figure 18:
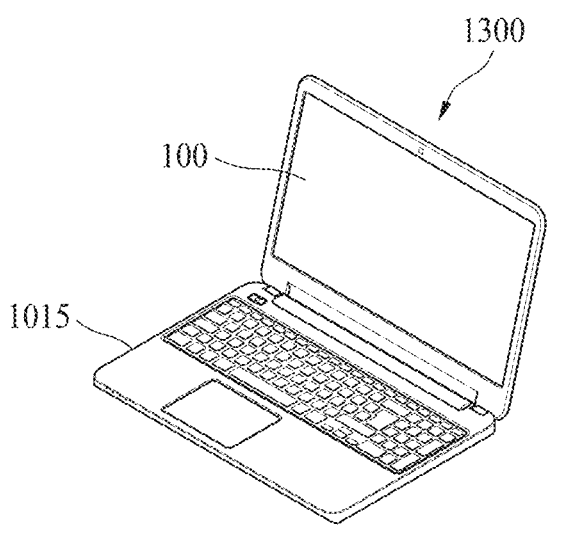
Figure 19:
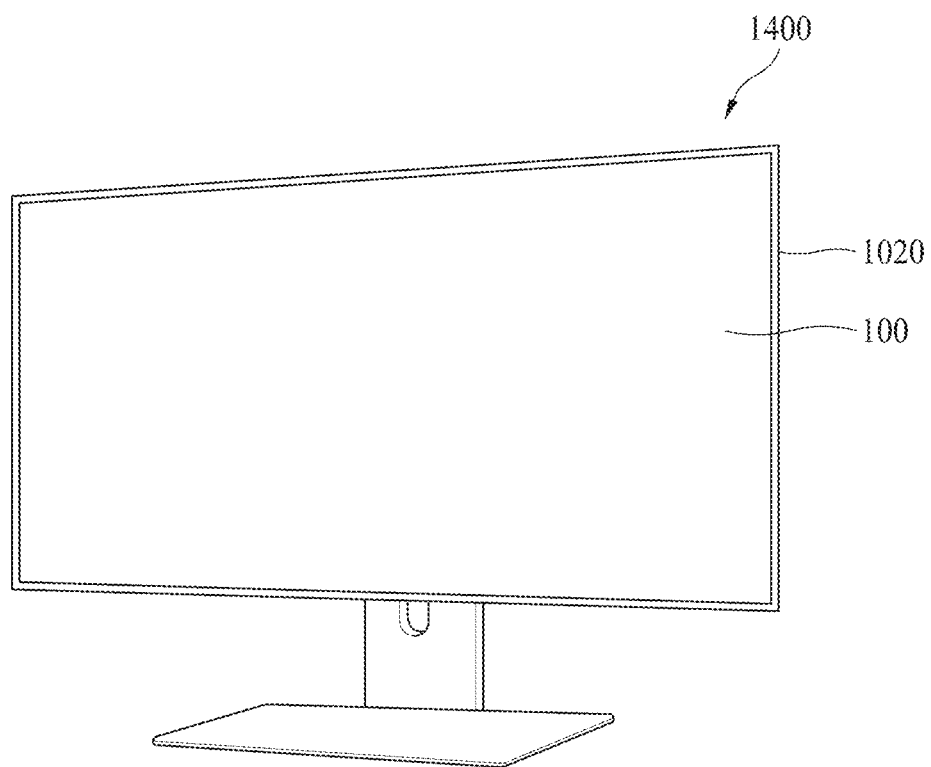

Referring to FIGS. 16 to 19, the display device according to embodiments of the present disclosure may be included in various devices or electronic devices. For example, various electronic devices may include a wearable device 1100 as shown in FIG. 16, a mobile device 1200 as shown in FIG. 17, a laptop 1300 as shown in FIG. 18, and a monitor or TV 1400 as shown in FIG. 19, but embodiments of the present disclosure are not limited thereto.

Each of the wearable device 1100, the mobile device 1200, the laptop 1300, and the monitor or TV 1400 may respectively include a case unit 1005, 1010, 1015, and 1020 and a display panel 100 and a display device 1000 according to the above-described embodiments of the present disclosure.

For example, the display device according to an embodiment of the present disclosure includes a mobile device, a video phone, a smart watch, a watch phone, a wearable device, a foldable device, a rollable device, a bendable device, a flexible device, a curved device, a sliding device, a variable device, an electronic notebook, an electronic book, a portable multimedia player (PMP), PDA (personal digital assistant), an MP3 player, a mobile medical device, a desktop PC, a laptop PC, a netbook computer, a workstation, a navigation, a vehicle display, a theater display, a television, a wall paper device, a signage device, a game device, a laptop, a game device, a monitor, a camera, a camcorder or a home appliance.

It will be apparent to those skilled in the art that the present disclosure described above is not limited by the above-described embodiments and the accompanying drawings and that various substitutions, modifications and variations can be made in the present disclosure without departing from the spirit or scope of the disclosures. Consequently, the scope of the present disclosure is defined by the accompanying claims and it is intended that all variations or modifications derived from the meaning, scope and equivalent concept of the claims fall within the scope of the present disclosure.

What is claimed is:

1. A display device comprising:
   a substrate including a first display area and a second display area adjacent to the first display area;
   a plurality of first pixels in the first display area on the substrate;
   a plurality of second pixels in the second display area on the substrate;
   a pixel driving circuit in each of the plurality of first pixels and each of the plurality of second pixels on the substrate;
   a plurality of sub-pixels in each of the plurality of first pixels and each of the plurality of second pixels on the pixel driving circuit; and
   a sensing unit in each of the plurality of second pixels on the pixel driving circuit;
   an insulating layer on the pixel driving circuit; and
   a plurality of banks in the plurality of sub-pixels and the sensing unit on the insulating layer,
   wherein each of the plurality of sub-pixels includes a light emitting device and the sensing unit includes a photo detector,
   wherein the light emitting device is a micro light emitting diode (LED), and
   wherein the light emitting device and the photo detector are on the plurality of banks.

2. The display device of claim 1, wherein the sensing unit is at one side of any one of the plurality of sub-pixels in each of the plurality of second pixels and the light emitting device and the photo detector are on a same plane.

3. The display device of claim 2, further comprising:
   a first electrode on the plurality of banks and a second electrode on the first electrode,
   wherein the first electrode supplies a first voltage applied from the pixel driving circuit to an anode of the light emitting device and an anode of the photo detector, and the second electrode supplies a second voltage applied from the pixel driving circuit to a cathode of the light emitting device and a cathode of the photo detector.

4. The display device of claim 3, wherein the light emitting device includes the anode on a bank from the plurality of banks, a first semiconductor layer on the anode, and a second semiconductor layer on the first semiconductor layer, wherein the photo detector includes the anode on the bank, a third semiconductor layer on the anode, and a fourth semiconductor layer on the third semiconductor layer, wherein the first semiconductor layer and the fourth semiconductor layer are semiconductor layers doped with impurities of any one of n-type or p-type, and wherein the second semiconductor layer and the third semiconductor layer are semiconductor layers doped with impurities of another of the n-type and the p-type.

5. The display device of claim 1, wherein the plurality of sub-pixels are on the sensing unit in each of the plurality of second pixels and the light emitting device and the photo detector are on different layers from each other.

6. The display device of claim 5, wherein the plurality of banks include a first plurality of banks on the insulating layer and a second plurality of banks on the first plurality of banks, and wherein the photo detector is on the first plurality of banks and the light emitting device is on the second plurality of banks.

7. The display device of claim 6, wherein a number of light emitting devices and a number of photo detectors are a same in each of the plurality of second pixels.

8. The display device of claim 6, wherein each of the plurality of second pixels includes a first sub-pixel and a second sub-pixel adjacent to the first sub-pixel, wherein the first sub-pixel includes:

a first photo detector; and a first light emitting device on the first photo detector and overlapping the first photo detector; and wherein the first sub-pixel includes:

a second photo detector; and a second light emitting device on the second photo detector and overlapping the second photo detector.

9. The display device of claim 6, further comprising:

a first optical layer on the insulating layer, the first optical layer including:

a first lower optical layer covering a side surface of the photo detector and a side surface of the first plurality of banks;

a first central optical layer between the first lower optical layer and the second plurality of banks; and a first upper optical layer covering a side surface of the light emitting device and a side surface of the second plurality of banks.

10. The display device of claim 9, further comprising:

a first electrode between the insulating layer and the first lower optical layer;

a second electrode between the first lower optical layer and the first central optical layer;

a third electrode between the first central optical layer and the first upper optical layer; and a fourth electrode on the first upper optical layer.

11. The display device of claim 10, wherein the first electrode supplies a first voltage applied from the pixel driving circuit to an anode of the photo detector, wherein the second electrode supplies a second voltage applied from the pixel driving circuit to a cathode of the photo detector, wherein the third electrode supplies a third voltage applied from the pixel driving circuit to an anode of the light emitting device, and wherein the fourth electrode supplies a fourth voltage applied from the pixel driving circuit to a cathode of the light emitting device.

12. The display device of claim 11, wherein the first voltage and the third voltage are a same and the second voltage and the fourth voltage are a same, wherein the light emitting device includes the anode on a bank from the plurality of banks, a first semiconductor layer on the anode, and a second semiconductor layer on the first semiconductor layer, wherein the photo detector includes the anode on the bank, a third semiconductor layer on the anode, and a fourth semiconductor layer on the third semiconductor layer, wherein the first semiconductor layer and the fourth semiconductor layer are semiconductor layers doped with impurities of any one of n-type or p-type, and wherein the second semiconductor layer and the third semiconductor layer are semiconductor layers doped with impurities of another of the n-type and the p-type.

13. The display device of claim 1, wherein the second display area is a central area of the substrate and the first display area is an area surrounding the second display area.

14. The display device of claim 1, wherein the photo detector absorbs any one of red light, green light, or blue light.

* * * * *